(12) United States Patent
Shibayama

(10) Patent No.: US 7,888,766 B2
(45) Date of Patent: Feb. 15, 2011

(54) PHOTODIODE ARRAY AND RADIATION DETECTOR HAVING DEPRESSIONS OF PREDETERMINED DEPTH FORMED IN REGIONS CORRESPONDING TO THE REGIONS WHERE THE PHOTODIODES ARE FORMED IN THE SEMICONDUCTOR SUBSTRATE

(75) Inventor: Katsumi Shibayama, Hamamatsu (JP)

(73) Assignee: Hamamatsu Photonics K.K., Hamamatsu-shi, Shizuoka (JP)

( * ) Notice: Subject to any disclaimer, the term of this patent is extended or adjusted under 35 U.S.C. 154(b) by 961 days.

(21) Appl. No.: 10/550,689

(22) PCT Filed: Mar. 25, 2004

(86) PCT No.: PCT/JP2004/004211

§ 371 (c)(1),
(2), (4) Date: Jul. 21, 2006

(87) PCT Pub. No.: WO2004/086504

PCT Pub. Date: Oct. 7, 2004

(65) Prior Publication Data

US 2007/0018212 A1    Jan. 25, 2007

(30) Foreign Application Priority Data

Mar. 27, 2003    (JP) ............................. P2003-087782

(51) Int. Cl.
*H01L 31/10*    (2006.01)
*G01J 1/44*    (2006.01)

(52) U.S. Cl. ...................... 257/466; 257/439; 257/461; 257/E31.038; 257/E31.057

(58) Field of Classification Search ................ 257/428, 257/431, 436, 443, 461, 464, 466, 439
See application file for complete search history.

(56) References Cited

U.S. PATENT DOCUMENTS

| | | | |
|---|---|---|---|
| 7,148,464 B2 * | 12/2006 | Shibayama | ............... 250/214.1 |
| 7,230,247 B2 * | 6/2007 | Shibayama | ............ 250/370.11 |
| 7,408,238 B2 * | 8/2008 | Shibayama | ................. 257/443 |
| 2002/0153492 A1 * | 10/2002 | Sekine et al. | .......... 250/370.11 |
| 2003/0034496 A1 | 2/2003 | Yoneta et al. | |

FOREIGN PATENT DOCUMENTS

| | | |
|---|---|---|
| EP | 1 548 836 | 6/2005 |
| JP | 57-42175 | 3/1982 |
| JP | 2-185070 | 7/1990 |
| JP | 5-121711 | 5/1993 |
| JP | 6-350068 | 12/1994 |
| JP | 7-333348 | 12/1995 |
| JP | 9-181243 | 7/1997 |
| JP | 2003-86826 | 3/2003 |
| WO | WO 96/36999 | 11/1996 |

\* cited by examiner

*Primary Examiner*—Anh D Mai
(74) *Attorney, Agent, or Firm*—Drinker Biddle & Reath LLP

(57) ABSTRACT

A photodiode array 1 is provided with an n-type silicon substrate 3. A plurality of photodiodes 4 are formed in array on the opposites surface side to an incident surface of light L to be detected, in the n-type silicon substrate 3. A depression 6 with a predetermined depth more depressed than a region not corresponding to regions where the photodiodes 4 are formed is formed in regions corresponding to the regions where the photodiodes 4 are formed, on the incident surface side of the light L to be detected, in the n-type silicon substrate 3.

7 Claims, 27 Drawing Sheets

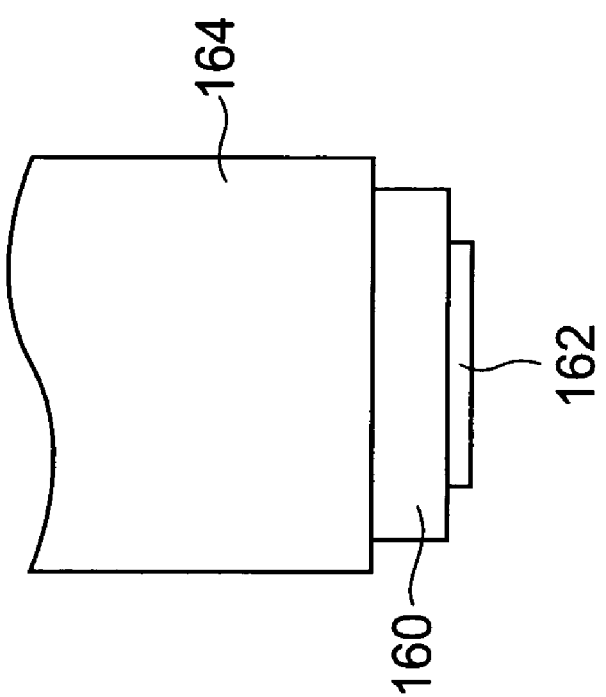
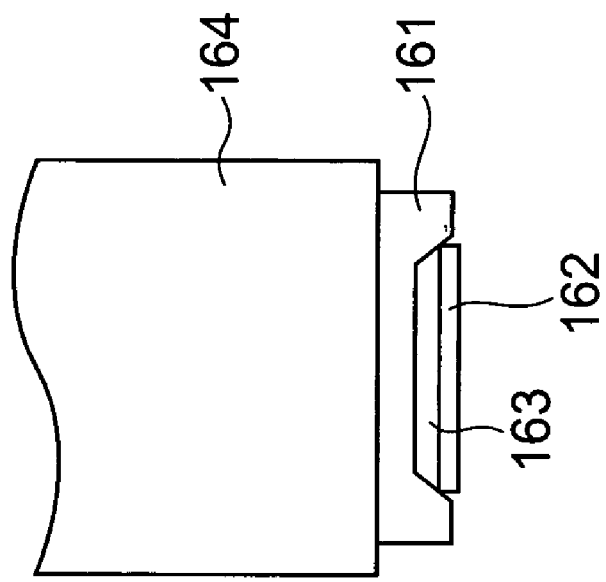
Fig.25A
Fig.25B

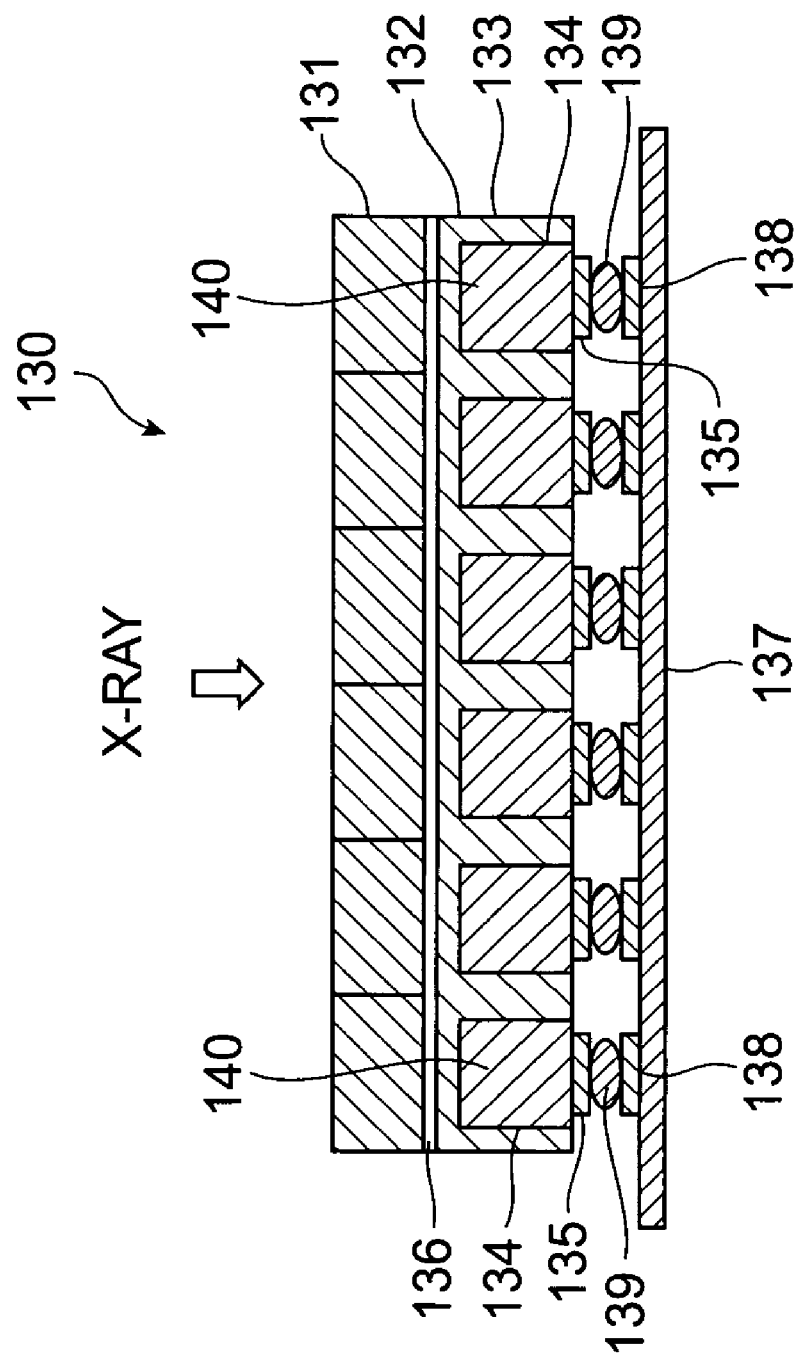

PHOTODIODE ARRAY AND RADIATION DETECTOR HAVING DEPRESSIONS OF PREDETERMINED DEPTH FORMED IN REGIONS CORRESPONDING TO THE REGIONS WHERE THE PHOTODIODES ARE FORMED IN THE SEMICONDUCTOR SUBSTRATE

TECHNICAL FIELD

The present invention relates to a photodiode array and production method thereof, and to a radiation detector.

BACKGROUND ART

The photodiode arrays of this type conventionally known include back-illuminated photodiode arrays of a type in which light is incident through the opposite surface (back surface) to a surface where bump electrodes or the like are formed (e.g., reference is made to Patent Document 1). The photodiode array disclosed in this Patent Document 1 has photodiodes 140 of pn junctions made by forming p-layers 134 of prismatic shape in an n-type silicon substrate 133, as shown in FIGS. 26 and 27. A scintillator 131 is bonded through a negative electrode film 136 to the back surface (the upper side in the drawing) opposite to the surface where the photodiodes 140 are formed (the lower side in the drawing). When light resulting from wavelength conversion in the scintillator 131 is incident into the photodiodes 140, each of the photodiodes 140 generates an electric current according to the incident light. The electric current generated in each photodiode 140 is outputted through positive electrode 135 formed on the front surface side, solder ball 139, and solder pad 138 provided on printed circuit board 137.

[Patent Document 1] Japanese Patent Application Laid-Open No. 7-333348

DISCLOSURE OF THE INVENTION

Incidentally, for mounting of the aforementioned photodiode array, e.g., a photodiode array for CT, a flat collet or a pyramid collet can be used as a collet for holding a chip under suction. The flat collet is normally used for flip chip bonding. The CT photodiode array has a large chip area (e.g., the square shape of 20 mm on each side). Where the pyramid collet 161 used in an ordinary mounter is used as shown in FIG. 25B, chip 162 will warp due to clearance 163 between chip 162 and pyramid collet 161. For this reason, in the case where the pyramid collet 161 is used, the warpage could cause positional misalignment and degrade the mounting accuracy of chip 162. The flip chip bonding process requires application of heat and pressure, but the efficiency of thermal conduction is poor in use of the pyramid collet 161. The pressure applied could damage the edge of chip 162. From the above it follows that the pyramid collet 161 is not suitable for suction holding of a thin chip. Therefore, in the case of the flip chip bonding, as shown in FIG. 25A, flat collet 160 to achieve surface contact with the chip surface is used to hold the chip 162 under suction, and the heat and pressure from heater block 164 is applied to the chip 162.

However, the use of the flat collet 160 results in bringing the entire chip surface of the chip 162 into contact with the flat collet 160. If the entire chip surface to become the light-incident surface is in contact with the flat collet 160 to be exposed to pressure and heat, regions corresponding to impurity diffused layers forming the photodiodes, on the chip surface could suffer physical damage. The damage on the chip surface will pose problems of appearance failure and characteristic degradation (increase in dark current and noise or the like).

The present invention has been accomplished in view of the above-described respects and an object of the invention is to provide a photodiode array and production method thereof capable of preventing the characteristic degradation while preventing the damage on the regions corresponding to the photodiodes during mounting, and to provide a radiation detector.

In order to achieve the above object, a photodiode array according to the present invention is a photodiode array comprising a semiconductor substrate, wherein a plurality of photodiodes are formed in array on an opposite surface side to an incident surface of light to be detected, in the semiconductor substrate, and wherein a depression with a predetermined depth more depressed than a region not corresponding to regions where the photodiodes are formed, is formed in regions corresponding to the regions where the photodiodes are formed, on a side of the incident surface of the light to be detected, in the semiconductor substrate.

In the photodiode array according to the present invention, the region not corresponding to the regions where the photodiodes are formed projects relative to the regions corresponding to the regions where the photodiodes are formed, on the incident surface side of the semiconductor substrate. In the case where the flat collet is used in mounting, the region not corresponding to the regions where the photodiodes are formed, creates a clearance between the flat collet and the regions corresponding to the regions where the photodiodes are formed. For this reason, the flat collet is kept out of direct contact with the regions corresponding to the photodiodes, whereby the regions corresponding to the photodiodes are prevented from being damaged by pressure and heat. In consequence, it is feasible to effectively prevent the characteristic degradation due to noise, dark current, and so on.

Preferably, the depression comprises a plurality of depressions, and adjacent depressions are in communication with each other. Preferably, the depression comprises a plurality of depressions formed corresponding to the respective photodiodes, and adjacent depressions are in communication with each other. In either of these cases, adjacent depressions are in communication with each other; therefore, in a case of applying a resin (e.g., an optical resin for mounting of a scintillator panel) onto the incident surface of the photodiode array, it becomes easier for the resin to spread into each of the depressions. It is also feasible to suppress generation of voids in each depression.

Preferably, the semiconductor substrate is provided with an impurity region between the photodiodes adjacent to each other, for separating the photodiodes from each other. In this case, the impurity region prevents occurrence of surface leak, and thus adjacent photodiodes can be electrically separated from each other with certainty.

Preferably, a high-impurity-concentration layer of the same conductivity type as the semiconductor substrate is formed on the incident surface side of the light to be detected, in the semiconductor substrate. In this case, carriers generated near the light-incident surface inside the semiconductor substrate efficiently migrate into each photodiode, without being trapped. This results in enhancing photodetecting sensitivity.

Preferably, a plurality of depressions having a predetermined depth are formed in array on the opposite surface side to the incident surface of the light to be detected, in the semiconductor substrate, and each photodiode is formed in a bottom portion of the associated depression. In this case, the distance becomes shorter between the incident surface of the light to be detected and the photodiodes in the semiconductor substrate, and thus recombination of carriers is suppressed in migration of carriers generated with incidence of the light to be detected. This results in improving the photodetecting sensitivity.

A photodiode array production method according to the present invention is a method of producing a photodiode array, the method comprising: a step of preparing a semiconductor substrate comprised of a semiconductor of a first conductivity type; a step of forming a plurality of impurity diffused layers of a second conductivity type on one surface side of the semiconductor substrate to form a plurality of photodiodes each comprised of the impurity diffused layer and the semiconductor substrate, in array; and a step of forming a depression with a predetermined depth more depressed than a region not corresponding to regions where the photodiodes are formed, in regions corresponding to the regions where the photodiodes are formed, on another surface of the semiconductor substrate.

The photodiode array production method according to the present invention permits us to obtain the photodiode array wherein the photodiodes are formed in array on one surface of the semiconductor substrate and wherein the depression is formed in the regions corresponding to the regions where the photodiodes are formed, on the other surface.

Preferably, the method further comprises a step of forming a high-impurity-concentration layer of the first conductivity type on the other surface of the semiconductor substrate, after the step of forming the depression. In this case, the high-impurity-concentration layer of the same conductivity type as the semiconductor substrate is formed on the other surface of the semiconductor substrate. For this reason, carriers generated near the light-incident surface inside the semiconductor substrate efficiently migrate into each photodiode, without being trapped. This results in enhancing the photodetecting sensitivity.

Another photodiode array production method according to the present invention is a method of producing a photodiode array, the method comprising: a step of preparing a semiconductor substrate comprised of a semiconductor of a first conductivity type; a step of forming a plurality of first depressions in array on one surface side of the semiconductor substrate; a step of forming a plurality of impurity diffused layers of a second conductivity type in bottom portions of the first depressions to form a plurality of photodiodes each comprised of the impurity diffused layer and the semiconductor substrate, in array; and a step of forming a second depression with a predetermined depth more depressed than a region not corresponding to regions where the photodiodes are formed, in regions corresponding to the regions where the photodiodes are formed, on another surface of the semiconductor substrate.

The photodiode array production method according to the present invention permits us to obtain the photodiode array wherein the photodiodes are formed in array in the bottom portions of the first depressions formed on one surface of the semiconductor substrate and wherein the second depression is formed in the regions corresponding to the regions where the photodiodes are formed, on the other surface.

Preferably, the method further comprises a step of forming a high-impurity-concentration layer of the first conductivity type on the other surface of the semiconductor substrate, after the step of forming the second depression. In this case, the high-impurity-concentration layer of the same conductivity type as the semiconductor substrate is formed on the other surface of the semiconductor substrate. For this reason, carriers generated near the light-incident surface inside the semiconductor substrate efficiently migrate into each photodiode, without being trapped. This results in enhancing the photodetecting sensitivity.

Preferably, the method further comprises a step of providing an impurity region of the first conductivity type between the impurity diffused layers adjacent to each other. In this case, the method permits us to obtain the photodiode array wherein adjacent photodiodes are electrically separated from each other with certainty.

A radiation detector according to the present invention is a radiation detector comprising: the above-described photodiode array; and a scintillator panel arranged opposite to the incident surface of the light to be detected in the photodiode array, and arranged to emit light with incidence of radiation.

Another radiation detector according to the present invention is a radiation detector comprising the photodiode array produced by the above-described photodiode array production method; and a scintillator panel arranged opposite to the surface where the depression is provided in the photodiode array, and arranged to emit light with incidence of radiation.

Still another radiation detector according to the present invention is a radiation detector comprising the photodiode array produced by the above-described photodiode array production method; and a scintillator panel arranged opposite to the surface where the second depression is formed in the photodiode array, and arranged to emit light with incidence of radiation.

Since each of these radiation detectors according to the present invention comprises the above-described photodiode array, it is feasible to effectively prevent the characteristic degradation due to noise, dark current, and so on.

BRIEF DESCRIPTION OF THE DRAWINGS

FIG. 25A is a view schematically showing a state in which a flat collet holds a semiconductor chip under suction.

FIG. 25B is a view schematically showing a state in which a pyramid collet holds a semiconductor chip under suction.

FIG. 27 is a schematic diagram showing a sectional configuration along direction XXVII-XXVII in FIG. 26.

BEST MODE FOR CARRYING OUT THE INVENTION

The preferred embodiments of the photodiode array and production method thereof, and the radiation detector according to the present invention will be described below in detail with reference to the drawings. The same elements, or elements with the same functionality will be denoted by the same reference symbols in the description, without redundant description.

First Embodiment

Figure 1:
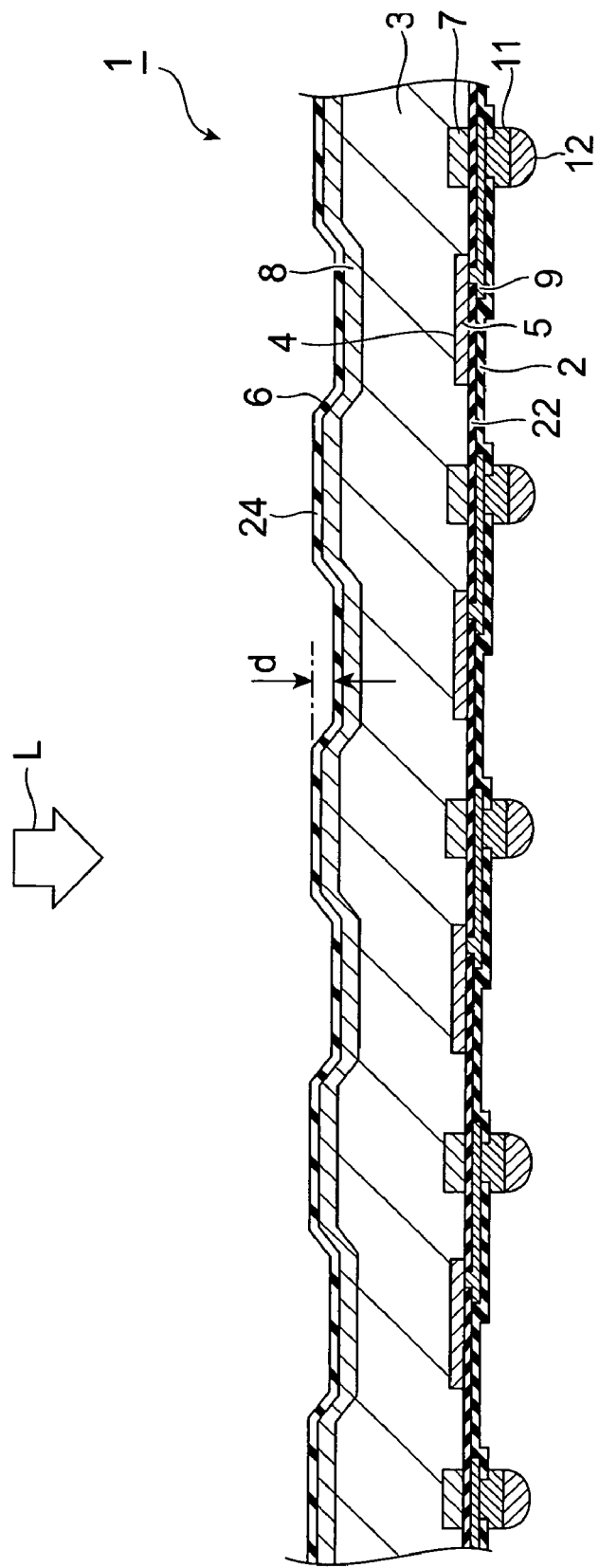
FIG. 1 is a view showing a sectional configuration of a photodiode array according to the first embodiment.

FIG. 1 is a view showing a sectional configuration of photodiode array 1 according to an embodiment of the present invention. In the description hereinafter, the incident surface of light L (the upper surface in FIG. 1) will be referred to as a back surface, and the opposite surface (the lower surface in FIG. 1) to it as a front surface. It is noted that the dimensions in each drawing below are altered as occasion may demand, for convenience sake of illustration.

The photodiode array 1 has a plurality of photodiodes 4 comprised of pn junctions. The plurality of photodiodes 4 are two-dimensionally arranged in a vertically and horizontally regular array on the front surface side of the photodiode array 1. Each photodiode 4 functions as a pixel of photodiode array 1 and the photodiodes 4 as a whole constitute one photosensitive region.

The photodiode array 1 has an n-type (first conductivity type) silicon substrate 3. The thickness of the n-type silicon substrate 3 is approximately 30-300 μm (preferably, 100 μm). The impurity concentration in the n-type silicon substrate 3 is approximately $1\times10^{12}$-$10^{15}$/cm$^3$. P-type (second conductivity type) impurity diffused layers 5 are two-dimensionally arranged in a vertically and horizontally regular array on the front surface side of the n-type silicon substrate 3. The thickness of the p-type impurity diffused layers 5 is approximately 0.05-20 μm (preferably, 0.2 μm). The impurity concentration in the p-type impurity diffused layers 5 is approximately $1\times10^{13}$-$10^{20}$/cm$^3$. The pn junctions formed of the p-type impurity diffused layers 5 and the n-type silicon substrate 3 constitute the photodiodes 4. A silicon oxide film 22 is formed on the front surface of the n-type silicon substrate 3. A passivation film 2 is formed on this silicon oxide film 22. The passivation film 2 is made, for example, of SiN or the like.

Electrode wirings 9 are formed corresponding to the respective p-type impurity diffused layers 5 (photodiodes 4), on the silicon oxide film 22. Each electrode wiring 9 is made of aluminum and has the thickness of about 1 μm. One end of each electrode wiring 9 is electrically connected through a contact hole formed in the silicon oxide film 22, to the corresponding p-type impurity diffused layer 5. The other end of each electrode wiring 9 is electrically connected through a contact hole formed in the passivation film 2, to a corresponding under bump metal (UBM) 11. A bump electrode 12 of solder is formed on each UBM 11. The UBM 11 and bump electrode 12 are electrically connected to each other.

The UBM 11 is preferably one achieving strong interface bonding to solder and being capable of preventing diffusion of a solder component into aluminum, and is often constructed in multilayer structure. An example of this multilayer structure is nickel (Ni)-gold (Au) by electroless plating. This structure is obtained by depositing a thick nickel plated layer (3-15 μm) on an aluminum-exposed region and depositing a thin gold plated layer (0.05-0.1 μm) thereon. The gold layer is provided for preventing oxidation of nickel. Other available structures include multilayer structures of titanium (Ti)-platinum (Pt)-gold (Au) and chromium (Cr)-gold (Au) formed by liftoff.

An accumulation layer 8 as a high-impurity-concentration layer is provided on the back surface side of the n-type silicon substrate 3. The accumulation layer 8 is formed in a substantially uniform depth across almost all the back surface. The accumulation layer 8 has the same conductivity type as the n-type silicon substrate 3 and the impurity concentration thereof is higher than that of the n-type silicon substrate 3. The photodiode array 1 of the present embodiment has the accumulation layer 8, but the photodiode array has the photodetecting sensitivity at a practically acceptable level, without provision of the accumulation layer 8.

An AR film 24 is formed on the accumulation layer 8, in order to cover and protect the accumulation layer 8 and to suppress reflection of light L. The AR film 24 is made, for example, of SiO$_2$ and has the thickness of about 0.01 to several μm. The AR film 24 may be formed in a multilayer or complex structure with SiN or with an optical film capable of preventing reflection at a desired wavelength, in addition to SiO$_2$.

On the front surface side of the n-type silicon substrate 3, a region where each p-type impurity diffused layer 5 exists is a region where a photodiode 4 is formed (hereinafter referred to as a "formed region"), and the region except for the formed regions constitutes a region where the photodiodes are not formed. A plurality of depressions 6 are provided corresponding to the respective photodiodes 4, in regions corresponding to the formed regions of the respective photodiodes 4 (the regions will be referred to hereinafter as "corresponding regions"). Each depression 6 is formed, for example, in rectangular shape in the size of 1 mm×1 mm and is more depressed than a region not corresponding to the formed regions of the photodiodes 4 (the region will be referred to hereinafter as a "noncorresponding region"). The depth d of each depression 6 is, for example, 3-150 μm and preferably approximately 10 μm.

An n$^+$-type impurity region 7 is provided between adjacent p-type impurity diffused layers 5, i.e., between adjacent photodiodes 4 in the n-type silicon substrate 3. The thickness of the n$^+$-type impurity region 7 is approximately 0.1-several ten μm. The n$^+$-type impurity region 7 functions as a separating layer for electrically separating adjacent photodiodes 4 (p-type impurity diffused layers 5) from each other. This can securely electrically separate adjacent photodiodes 4 from each other and reduce crosstalk between photodiodes 4. The photodiode array 1 in the present embodiment, without the n$^+$-type impurity region 7, possesses the photodetecting characteristics at a practically acceptable level.

Figure 2:
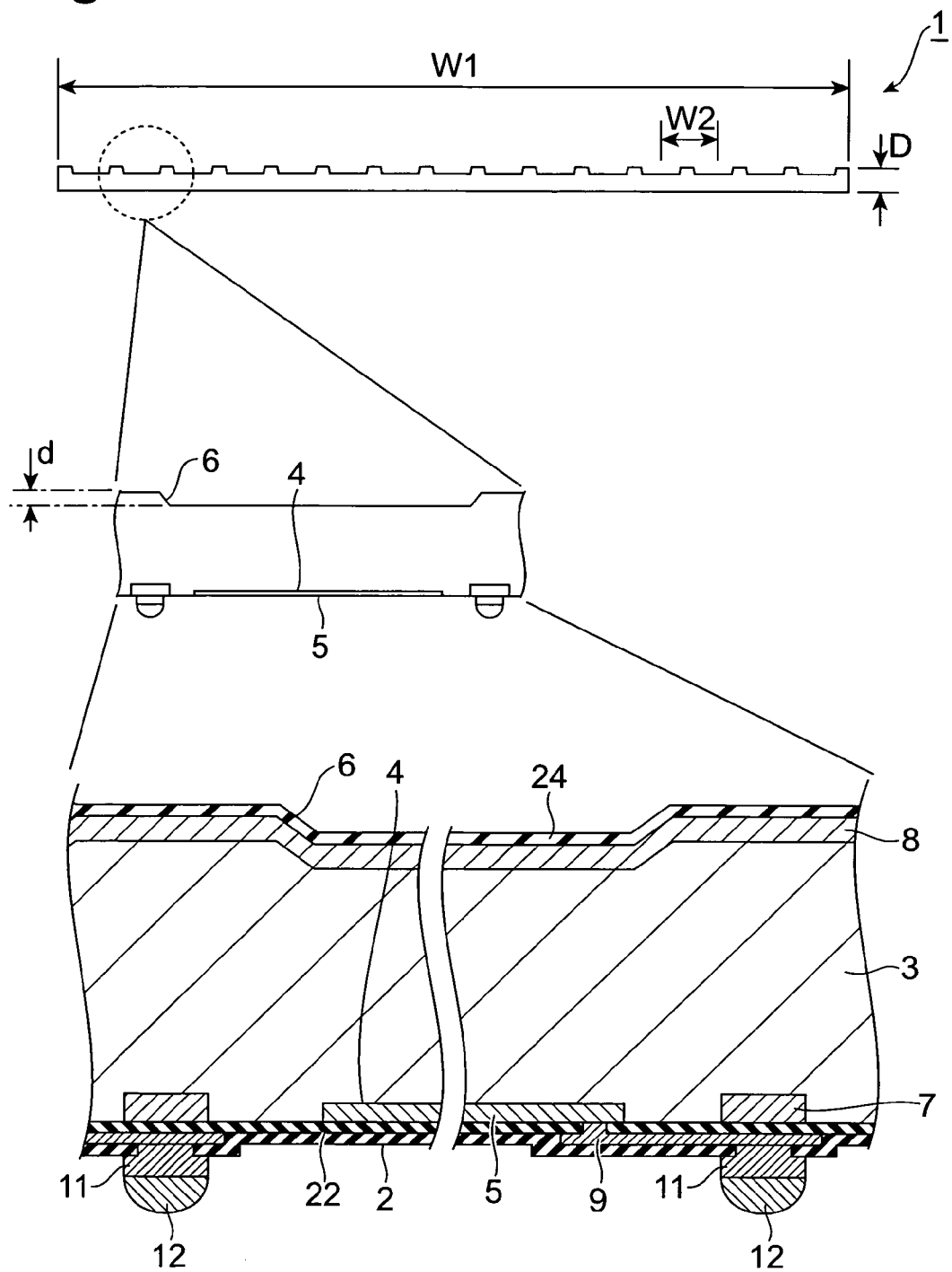
FIG. 2 is a view for explaining the configuration of the photodiode array according to the first embodiment.

The photodiode array 1 is of extremely thin plate shape, as shown in FIG. 2. The width W1 of photodiode array 1 is approximately 22.4 mm, and the thickness D of photodiode array 1 approximately 0.3 mm. The photodiode array 1 has a number of aforementioned photodiodes 4 (e.g., a two-dimensional array of 256 (16×16) photodiodes). The pitch W2 between adjacent photodiodes 4 (pixels) is approximately 1.4 mm. The photodiode array 1 is a chip of a large area (e.g., 22.4 mm×22.4 mm). The top illustration in FIG. 2 is one for showing how thin the photodiode array 1 is, and the details of the photodiode array 1 are illustrated in enlarged views.

In the photodiode array 1, when light L is incident on the back surface, the incident light L passes through the accumulation layer 8 to reach the pn junctions. Then each photodiode 4 generates carriers according to the incident light. At this time, the accumulation layer 8 prevents the carriers generated near the light-incident surface (back surface) inside the n-type silicon substrate 3 from being trapped at the light-incident surface and the interface to the AR film 24. This permits the carriers to efficiently migrate to the pn junctions and thus enhances the photodetecting sensitivity of the photodiode array 1. A photocurrent caused by generated carriers is extracted through electrode wiring 9 and UBM 11 connected to each p-type impurity diffused layer 5, and from bump electrode 12. The incident light is detected based on the output from the bump electrode 12.

In the present embodiment, as described above, the depressions 6 are formed in the corresponding regions of the respective photodiodes 4 on the light-incident surface side of the light L (i.e., the back surface side) in the photodiode array 1, and thus the noncorresponding region of each photodiode 4 projects by the distance corresponding to the depth d relative to the corresponding regions. In the case where the flip chip bonding is carried out with the flat collet holding the photodiode array 1 under suction, the noncorresponding region of each photodiode 4 comes into contact with the flat collet and functions to secure a clearance between the flat collet and the corresponding region of each photodiode 4. In this configuration, the corresponding region of each photodiode 4 is protected by the noncorresponding region while being kept out of direct contact with the flat collet. Therefore, the corresponding region of each photodiode 4 gets rid of direct stress due to pressure and direct stress due to heat, so that the accumulation layer 8 in the corresponding region is prevented from suffering physical damage. The photodiodes 4 are thus free of the dark current and noise caused by crystal defects or the like due to such damage. In consequence, the photodiode array 1 is able to perform photodetection with high accuracy (at high S/N ratios).

In cases except for the flip chip bonding, e.g., in a case where the photodiode array 1 is integrated with a scintillator to be used as a CT sensor, as described later, the scintillator is kept out of direct contact with the corresponding regions, and it is thus feasible to avoid damage during mounting of the scintillator.

Figure 13A:
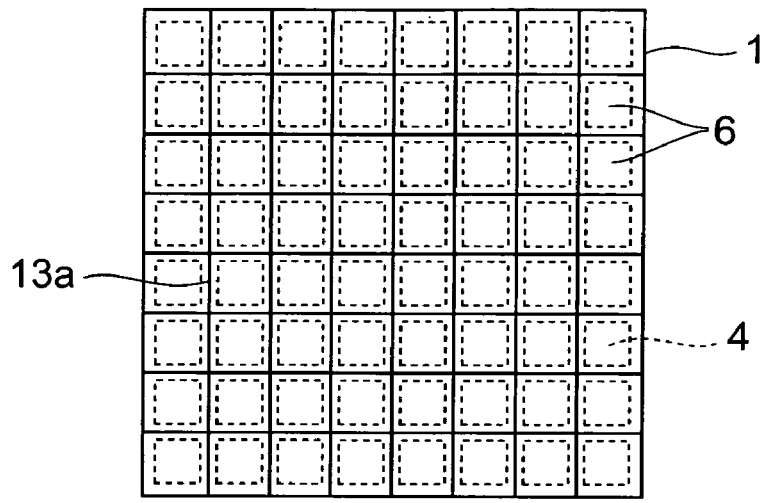
FIG. 13A is a plan view schematically showing an example of the photodiode array according to the first embodiment.
Figure 13B:
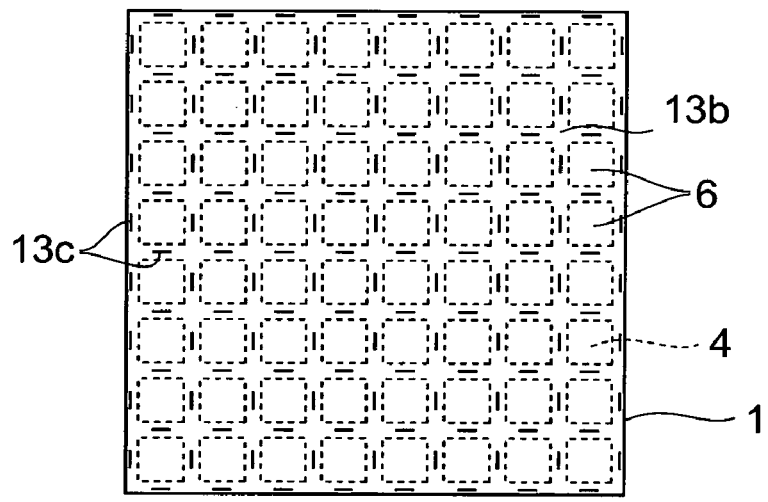
FIG. 13B is a plan view schematically showing an example of the photodiode array according to the first embodiment.
Figure 13C:
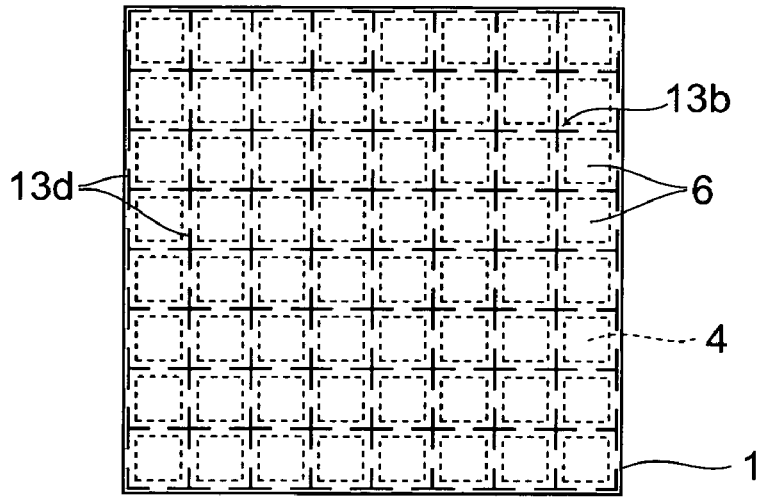
FIG. 13C is a plan view schematically showing an example of the photodiode array according to the first embodiment.

The depressions 6 are formed corresponding to photodiodes 4 in such a manner that one depression is provided or each photodiode 4. For forming the depressions 6 in this manner, as shown in FIG. 13A, a wall part 13*a* can be formed in a lattice pattern in the noncorresponding region of the photodiodes 4. In another configuration, as shown in FIG. 13B, a plurality of short wall portions 13*c* may be discontinuously formed in portions except for intersections 13*b* in the noncorresponding region of the photodiodes 4. In still another configuration, as shown in FIG. 13C, wall portions 13*d* of cross shape may be formed at intersections 13*b*. In a further configuration, which is not shown, the depressions 6 may be formed in a plurality of separate regions, for example, by dividing the region into two large areas left and right.

The accumulation layer 8 is formed on the entire back surface side of the n-type silicon substrate 43. The AR film 24 is formed on the accumulation layer 8. This accumulation layer 8 and the AR film 24 are similar to those in the aforementioned photodiode array 1. A plurality of depressions 6 (second depressions) are formed corresponding to the respective depressions 45 in the corresponding regions of the photodiodes 4 so that one depression is provided for each photodiode 4. The depressions 6 are also similar to those in the aforementioned photodiode array 1.

Where the depressions 6 are formed in this manner, adjacent depressions 6 are preferably formed in communication with each other, without being partitioned by the noncorresponding region of the photodiodes 4. For implementing it, for example, the noncorresponding region may be formed by discontinuously arranging the aforementioned wall portions 13*c*, 13*d*.

Figure 14A:
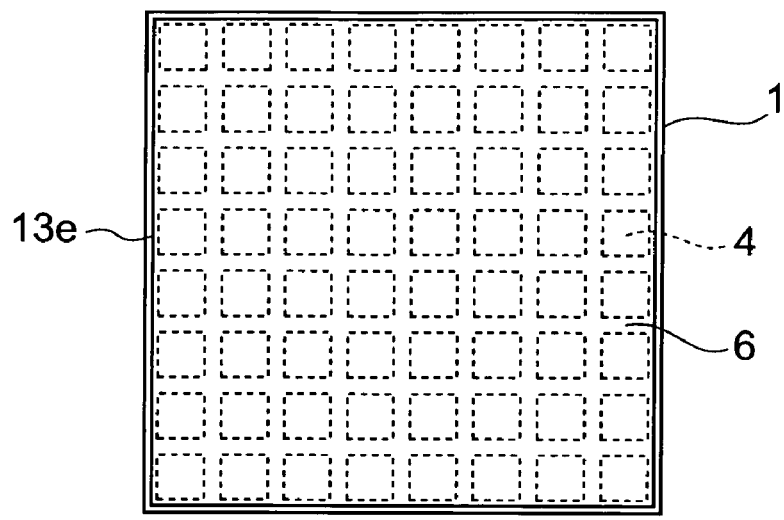
FIG. 14A is a plan view schematically showing an example of the photodiode array according to the first embodiment.
Figure 14B:
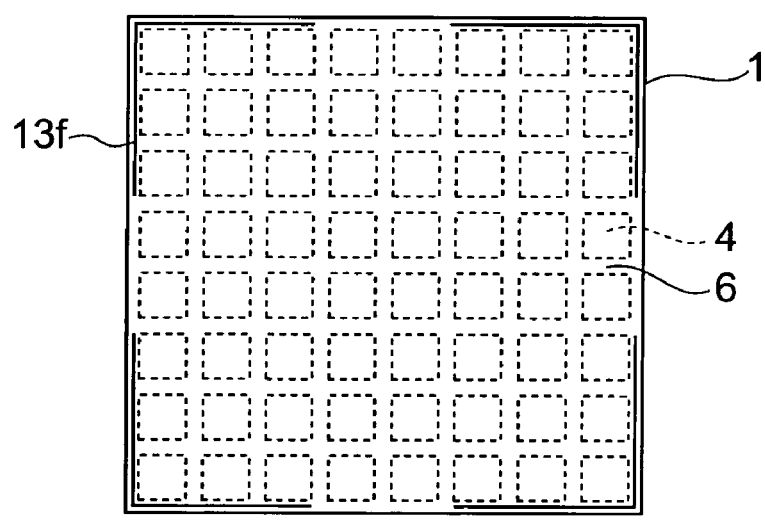
FIG. 14B is a plan view schematically showing an example of the photodiode array according to the first embodiment.

It is also possible to adopt a configuration, as shown in FIG. 14A, wherein a wall portion 13*e* of frame shape is formed at the edge of the photodiode array 1 so that the entire region inside this wall portion 13*e* constitutes one depression 6. This wall portion 13*e* may be replaced by wall portions 13*f* of partly cut frame shape, as shown in FIG. 14B. In these cases, the depression 6 is formed without being partitioned by the noncorresponding region.

The entire noncorresponding region of the photodiodes 4 does not have to be formed so as to be thicker than the depressions 6, but the necessary condition is that a part of the noncorresponding region (the portion where the wall portion 13*e*, 13*f* is formed) is formed so as to be thicker than the depressions 6, as shown in FIGS. 14A and 14B. On the other hand, the corresponding regions of the photodiodes 4 all have to be provided in the depressions 6.

In the configurations where adjacent depressions 6 are in communication with each other without being partitioned, the clearance between adjacent wall portions functions as an escape for resin (e.g., optical resin 35 used in bonding of scintillator panel 31 described later). In applying the resin onto the back surface of the photodiode array 1, therefore, voids (air bubbles) are unlikely to be made in the depressions 6 (to decrease the number of voids), whereby the applied resin can uniformly spread into each depression 6 to be uniformly filled.

Figure 14C:
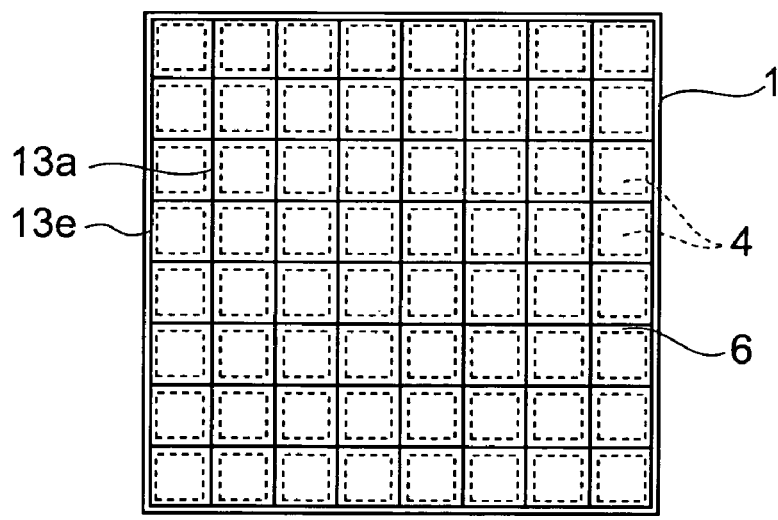
FIG. 14C is a plan view schematically showing an example of the photodiode array according to the first embodiment.

It is also possible to continuously provide the wall portions 13*a* and wall portion 13*e*, as shown in FIG. 14C, and in this case, each depression 6 is partitioned off by the wall portions 13*a* and wall portion 13*e*.

Next, a production method of the photodiode array 1 according to the present embodiment will be described below on the basis of FIGS. 3 to 12.

Figure 3:
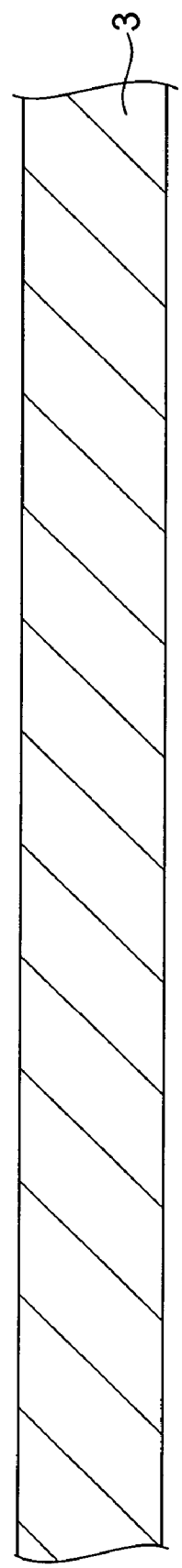
FIG. 3 is a view for explaining a production step of the photodiode array according to the first embodiment.
Figure 4:
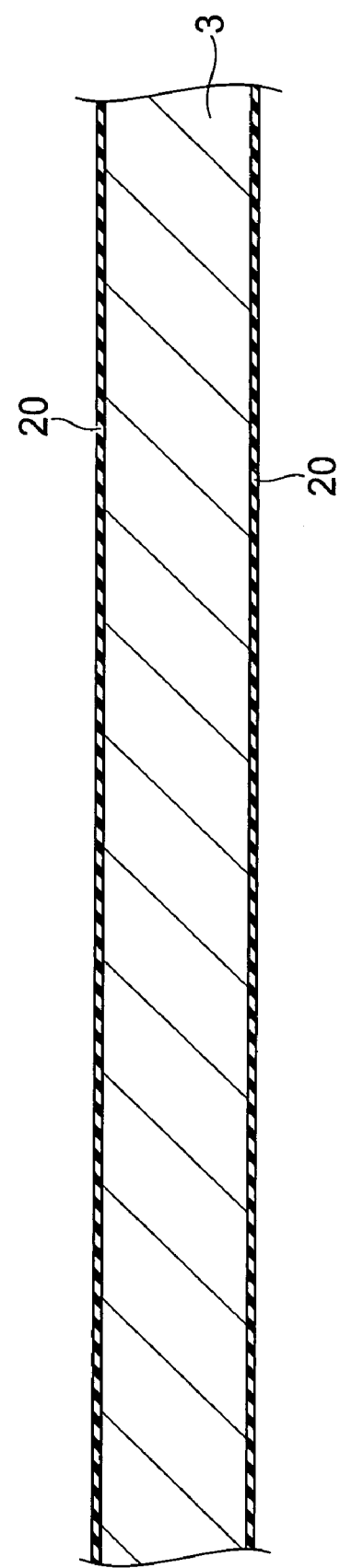
FIG. 4 is a view for explaining a production step of the photodiode array according to the first embodiment.
Figure 5:
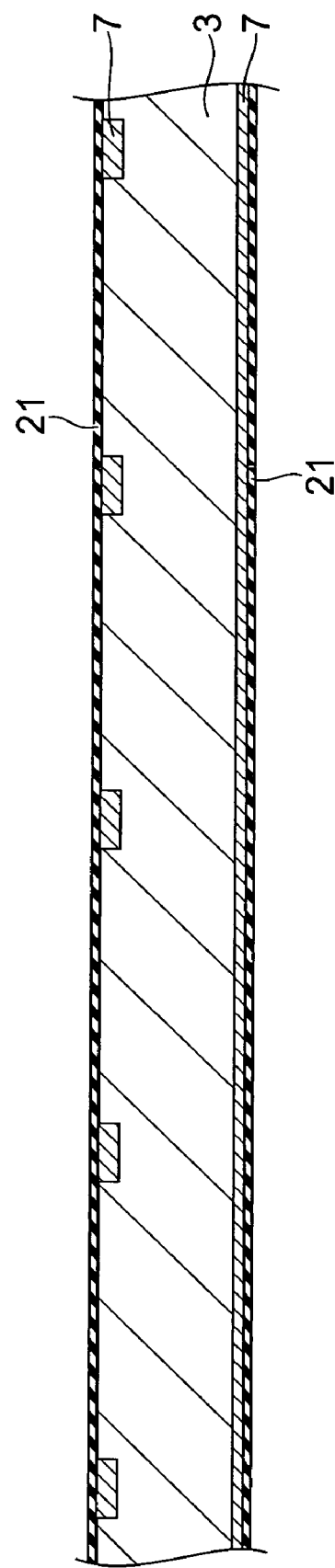
FIG. 5 is a view for explaining a production step of the photodiode array according to the first embodiment.
Figure 6:
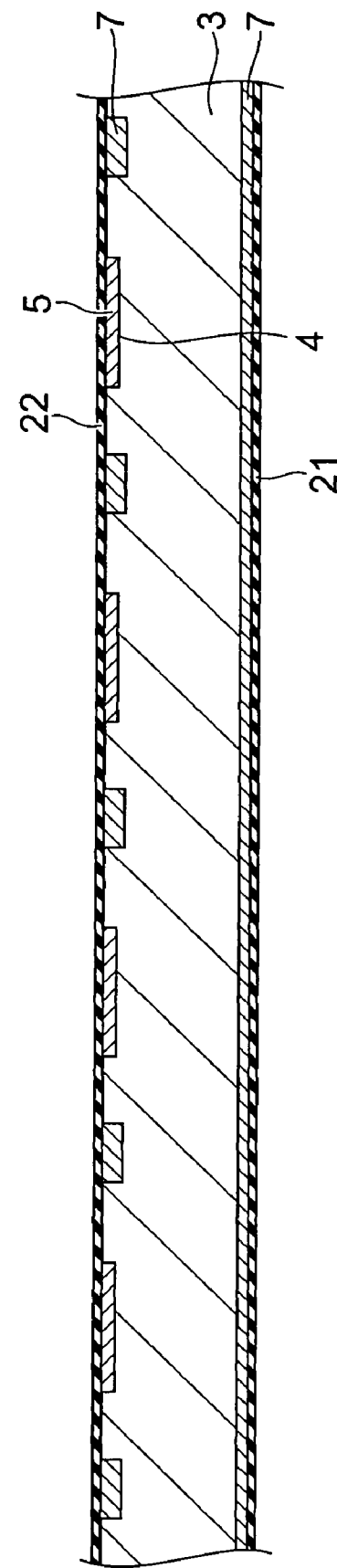
FIG. 6 is a view for explaining a production step of the photodiode array according to the first embodiment.
Figure 7:
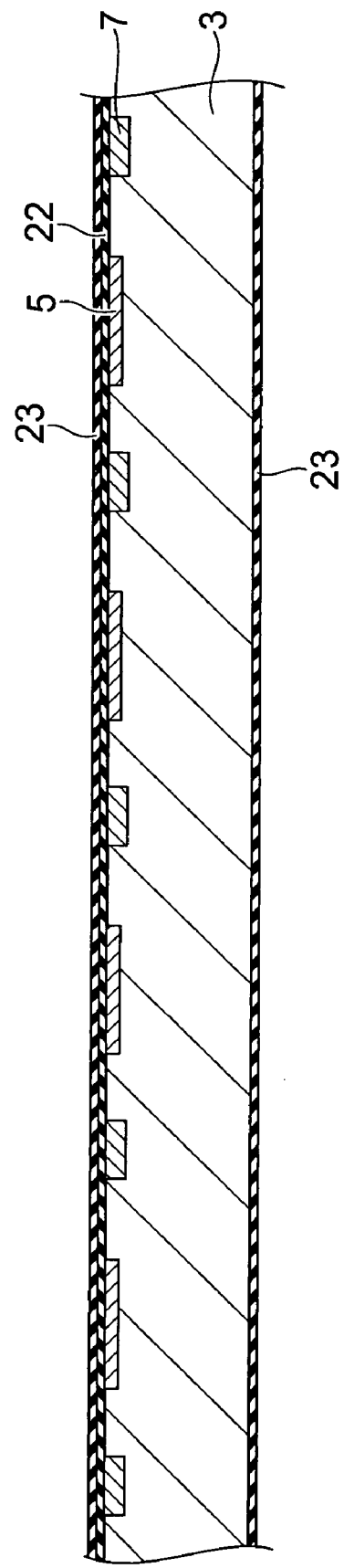
FIG. 7 is a view for explaining a production step of the photodiode array according to the first embodiment.
Figure 8:
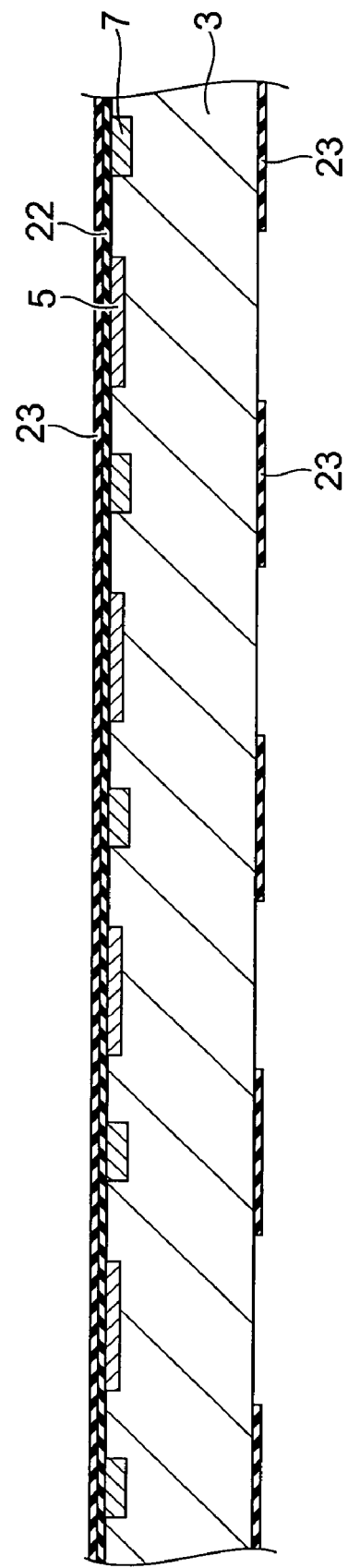
FIG. 8 is a view for explaining a production step of the photodiode array according to the first embodiment.
Figure 9:
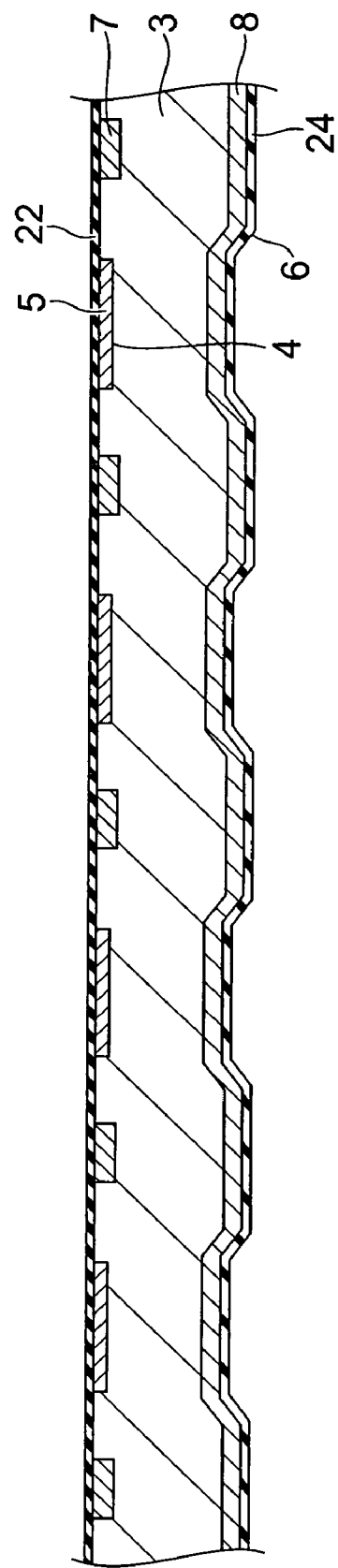
FIG. 9 is a view for explaining a production step of the photodiode array according to the first embodiment.
Figure 10:
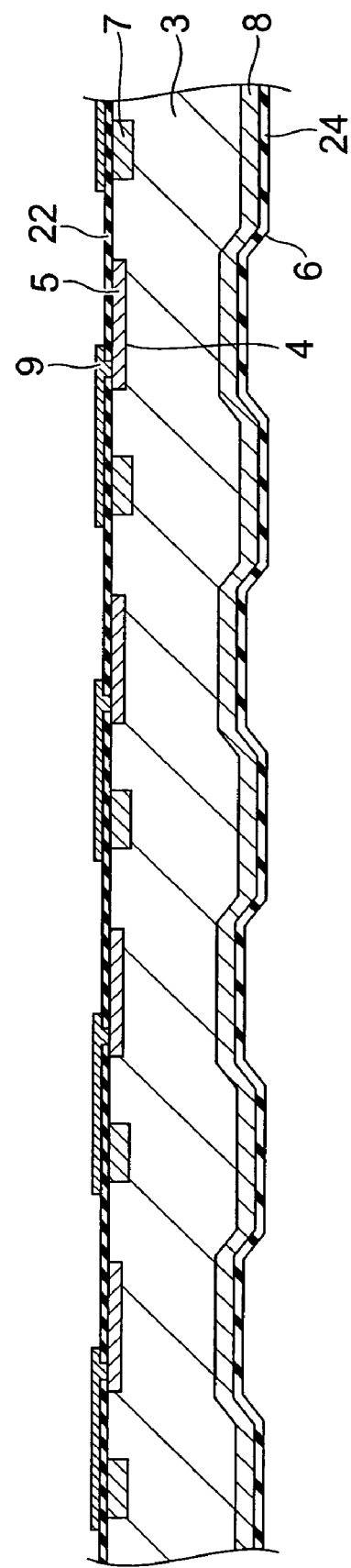
FIG. 10 is a view for explaining a production step of the photodiode array according to the first embodiment.

The first step is to prepare an n-type silicon substrate 3 having the thickness of about 150-500 μm (preferably, 350 μm), as shown in FIG. 3. Next, a silicon oxide film (SiO$_2$) 20 is formed on the front surface and on the back surface of the n-type silicon substrate 3 (cf. FIG. 4).

Next, the silicon oxide film 20 formed on the front surface of the n-type silicon substrate 3 is patterned with a predetermined photomask to form openings at intended positions for formation of the n$^+$-type impurity regions 7. Then the n-type silicon substrate 3 is doped with phosphorus through the openings formed in the silicon oxide film 20, to provide the n$^+$-type impurity regions 7 in the n-type silicon substrate 3. In the present embodiment, the n$^+$-type impurity region 7 is also formed on the back surface side of the n-type silicon substrate 3. This step (impurity region forming step) may be omitted if the n$^+$-type impurity regions 7 are not provided. Subsequently, a silicon oxide film 21 is again formed on the front surface and on the back surface of the n-type silicon substrate 3 (cf. FIG. 5). This silicon oxide film 21 is used as a mask in the subsequent step of forming the p-type impurity diffused layers 5.

Next, the silicon oxide film 21 formed on the front surface of the n-type silicon substrate 3 is patterned with a predetermined photomask to form openings at intended positions for formation of the respective p-type impurity diffused layers 5. The substrate is doped with boron through the openings formed in the silicon oxide film 21, to form the p-type impurity diffused layers 5 in two-dimensional arrangement of a vertical and horizontal array. This results in forming photodiodes 4 of pn junctions between each p-type impurity diffused layer 5 and n-type silicon substrate 3 in two-dimensional arrangement of a vertical and horizontal array. Each photodiode 4 becomes a portion corresponding to a pixel. Subsequently, a silicon oxide film 22 is again formed on the front surface side of the substrate (cf. FIG. 6).

Next, the back surface of the n-type silicon substrate 3 is polished up to a predetermined thickness (about 30-300 μm) to obtain the n-type silicon substrate 3 in thin shape (thin plate). Subsequently, a silicon nitride film (SiN) 23 is formed on the front surface and on the back surface of the n-type silicon substrate 3 by LP-CVD (or plasma CVD) (cf FIG. 7). Then patterning with a predetermined photomask is carried out to remove the intended regions for formation of the respective depressions 6, i.e., the silicon nitride film 23 from the corresponding regions of the photodiodes 4 and to leave the portions where the depressions 6 are not formed, i.e., the silicon nitride film 23 in the noncorresponding region of the photodiodes 4 (cf. FIG. 8). In this step, the regions where the silicon nitride film 23 is left can be appropriately modified, whereby the noncorresponding region (wall portions 13a, 13c, 13d, 13e, 13f) can be formed in the aforementioned various patterns.

Next, the n-type silicon substrate 3 is etched by anisotropic alkali etching with potassium hydroxide solution (KOH), TMAH, or the like, using the left silicon nitride film 23 as a mask, to form the depressions 6 in the portions not covered by the silicon nitride film 23. Thereafter, the left silicon nitride film 23 is removed. Then an n-type ion species (e.g., phosphorus or arsenic) is allowed to diffuse from the back surface of the n-type silicon substrate 3 into the depth of about 0.05 to several ten μm, thereby forming the aforementioned accumulation layer 8 with the impurity concentration higher than that of the n-type silicon substrate 3. Furthermore, thermal oxidation is carried out to form the AR film 24 on the accumulation layer 8 (cf. FIG. 9).

Next, contact holes extending to the respective p-type impurity diffused layers 5 are formed in the formed regions of the respective photodiodes 4 and in the silicon oxide film 22 by the photoetching technology. Subsequently, an aluminum metal film is formed on the silicon oxide film 22 by evaporation, and thereafter it is patterned with a predetermined photomask to form electrode wirings 9 (cf. FIG. 10). Then an SiN film 25 to become the passivation film 2 is formed on the silicon oxide film 22 so as to cover the electrode wirings 9. The SiN film 25 can be formed by sputtering, plasma CVD, or the like. The passivation film 2 may be one selected from the insulating films of SiO$_2$, PSG, BPSG, etc., polyimide resin, acrylate resin, epoxy resin, fluororesin, composite films and multilayer films thereof, and so on.

Figure 11:
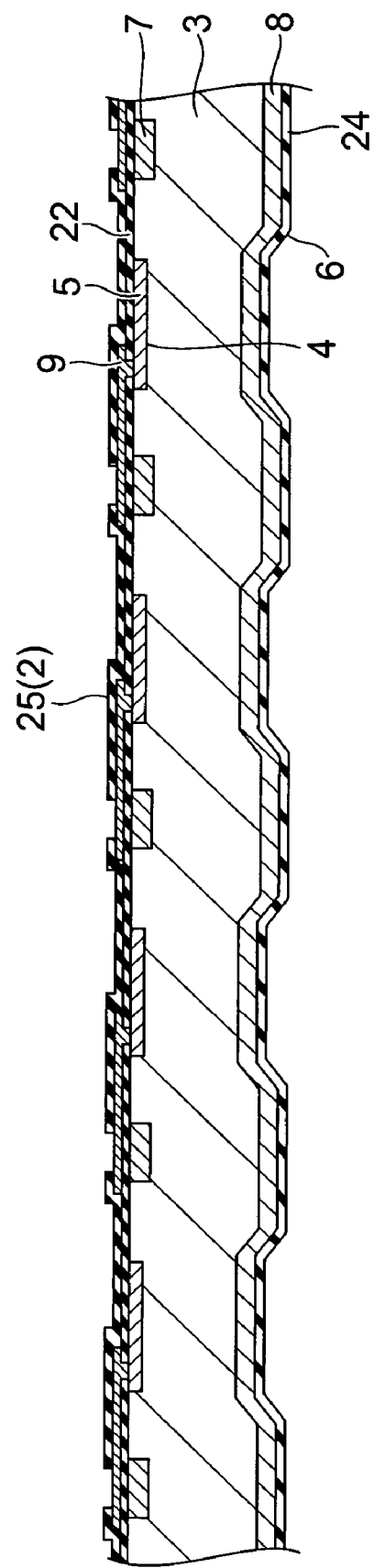
FIG. 11 is a view for explaining a production step of the photodiode array according to the first embodiment.
Figure 12:
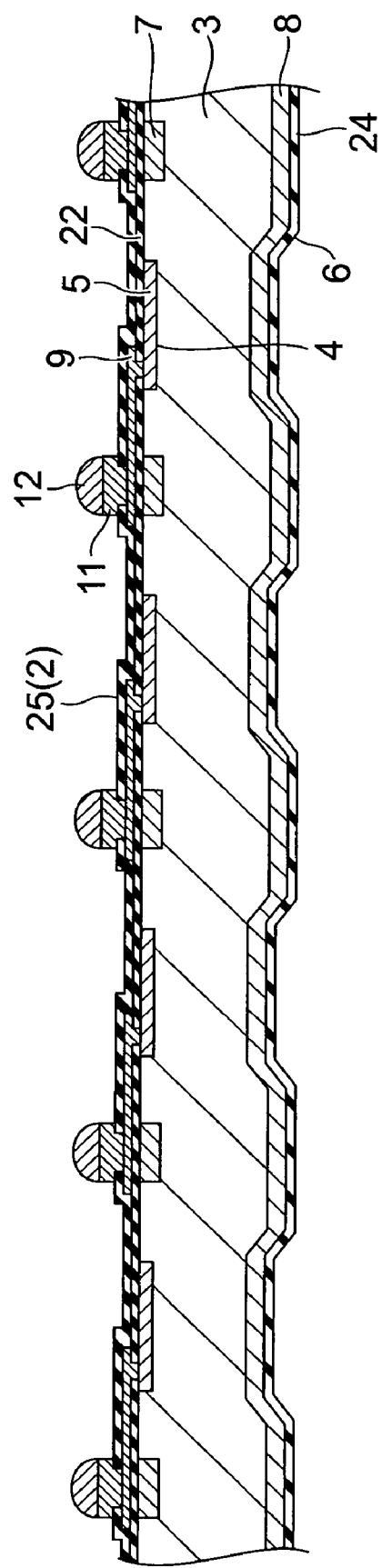
FIG. 12 is a view for explaining a production step of the photodiode array according to the first embodiment.

Next, contact holes are formed at predetermined positions in the SiN film 25 to make electrode extracting portions (cf. FIG. 11). Furthermore, the bump electrodes 12 are to be formed. Where the bump electrodes 12 are of solder, since the solder has poor wettability to aluminum, UBM 11 for intervention between each electrode extracting portion and bump electrode 12 is formed on each electrode extracting portion. Then the bump electrode 12 is formed over each UBM 11 (cf. FIG. 12).

Through the above steps, the production method permits us to produce the photodiode array 1 capable of performing photodetection with high accuracy, without occurrence of noise due to damage in mounting.

The bump electrodes 12 can be made by placing solder on the predetermined UBM 11 by the solder ball mounting method or printing method and reflowing the solder. The bump electrodes 12 are not limited to the solder bumps, but may be gold bumps, nickel bumps, or copper bumps, or may be electroconductive resin bumps containing such metal as an electroconductive filler. The drawings show only the extraction of the anode electrodes, and the cathode (substrate) electrodes can also be similarly extracted from the n$^+$-type impurity regions 7 (though not shown) in the same manner as the anode electrodes. The drawings show the case where the bump electrodes 12 of the anode electrodes are formed in the areas of the n$^+$-type impurity regions 7, but the bump electrodes 12 of the anode electrodes may be formed in the areas of the p-type impurity diffused layers 5.

Second Embodiment

Next, the second embodiment of the photodiode array and production method thereof will be described.

Figure 15:
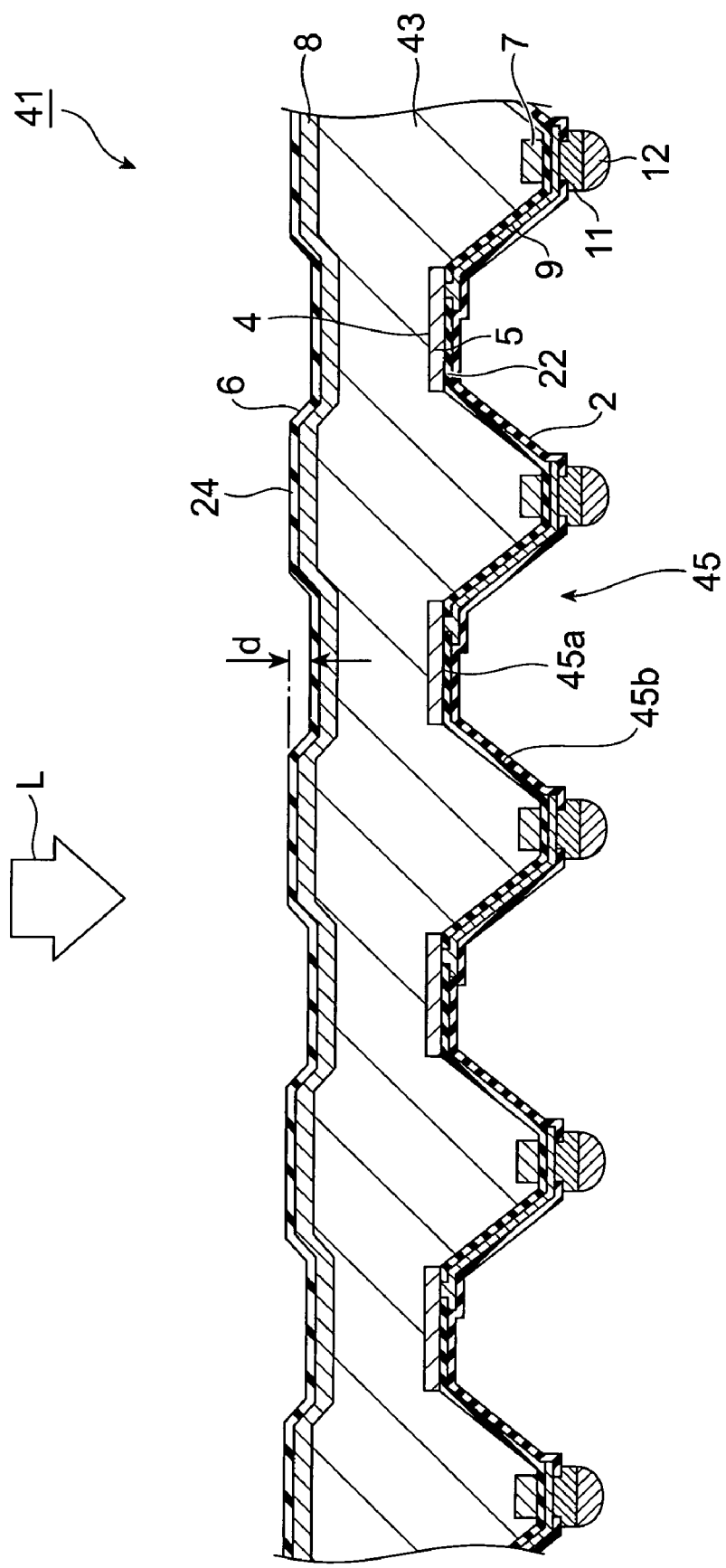
FIG. 15 is a view showing a sectional configuration of a photodiode array according to the second embodiment.

The present embodiment is directed to a photodiode array 41 having an n-type silicon substrate 43 in which depressions 45 (first depressions) are formed on the opposite surface side (front surface side) to the incident surface of light L, as shown in FIG. 15. Since this photodiode array 41 has common portions to the photodiode array 1, the description below will be given with focus on the differences between them, while omitting or simplifying the description of the common portions.

In the photodiode array 41, a plurality of depressions 45 are formed in two-dimensional arrangement of a vertically and horizontally regular array on the front surface side of the n-type silicon substrate 43. Each depression 45 is made by recessing a predetermined region of the n-type silicon substrate 43 so as to make it thinner than the region around it, and the depressions 45 are formed at arrangement intervals of about 1.4-1.5 mm. The aforementioned photodiodes 4 are formed in respective bottom portions 45a of the depressions 45, thereby constituting the photodiode array 41 in which the photodiodes 4 are two-dimensionally arranged in array.

Each depression 45 is formed with a rectangular opening, for example, in the size of about 1 mm×1 mm in the front surface of the n-type silicon substrate 43 so that the aperture size gradually decreases from the opening toward the bottom portion 45a (i.e., from the front surface side toward the back surface side). In this configuration, each depression 45 has a slope side surface 45b. The depth from the front surface of the n-type silicon substrate 43 to the bottom portion 45a is, for example, about 50 µm.

Electrode wirings 9 are formed along side faces 45b and on the silicon oxide film 22. One end of each electrode wiring 9 is electrically connected through a contact hole formed in the silicon oxide film 22, to the corresponding p-type impurity diffused layer 5. The other end of each electrode wiring 9 is electrically connected through a contact hole formed in the passivation film 2, to the corresponding UBM 11. An $n^+$-type impurity region 7 is provided between adjacent photodiodes 4.

The accumulation layer 8 is formed on the entire back surface side of the n-type silicon substrate 3. The AR film 24 is formed on the accumulation layer 8. This accumulation layer 8 and the AR film 24 are similar to those in the aforementioned photodiode array 1. A plurality of depressions 6 (second depressions) are formed corresponding to the respective depressions 45 in the corresponding regions of the photodiodes 4 so that one depression is provided for each photodiode 4. The depressions 6 are also similar to those in the aforementioned photodiode array 1.

The accumulation layer 8 permits the carriers generated near the light-incident surface (back surface) inside the n-type silicon substrate 43 to efficiently migrate to the pn junctions, without recombination. This permits the photodiode array 41 to have higher photodetecting sensitivity (though the photodiode array 41 of the present embodiment has the detection sensitivity at a practically acceptable level, without provision of the accumulation layer 8).

In the photodiode array 41 constructed as described above, when light L is incident on the back surface, just as in the case of the photodiode array 1, the incident light L passes through the accumulation layer 8 to reach the pn junctions. Each photodiode 4 generates carriers according to the incident light. Since each pn junction is provided in the bottom portion 45a of depression 45, the distance is shorter between the back surface of the n-type silicon substrate 43 and the pn junction (e.g., approximately 10-100 µm). Therefore, the photodiode array 41 is configured to prevent a situation in which the carriers generated with incidence of light L annihilate through recombination in the process of migration. In consequence, the photodiode array 41 is able to maintain high detection sensitivity.

As described above, the photodiode array 41 of the present embodiment is also provided with the depressions 6 formed in the corresponding regions of the respective photodiodes 4 as the photodiode array 1 was. Where the photodiode array 41 is held in suction by the flat collet to be subjected to the flip chip bonding, the noncorresponding region of each photodiode 4 comes into contact with the flat collet and functions to secure the clearance between the flat collet and the corresponding region of each photodiode 4. In this configuration, the corresponding region of each photodiode 4 is protected by the noncorresponding region so as to be kept out of direct contact with the flat collet. Therefore, the corresponding regions of the respective photodiodes 4 get rid of direct stress due to pressure and direct stress due to heat, whereby the accumulation layer 8 in the corresponding regions is free of physical damage. In the photodiodes 4 there is neither dark current nor noise caused by crystal defects or the like due to such damage. In consequence, the photodiode array 1 is able to perform photodetection with high accuracy (at high S/N ratios).

A photocurrent caused by generated carriers is extracted through electrode wiring 9 and UBM 11 connected to each p-type impurity diffused layer 5, and from bump electrode 12. The incident light is detected based on the output from bump electrode 12. This is much the same as in the case of the photodiode array 1.

As described above, the photodiode array 41 of the present embodiment is also provided with the depressions 6 formed in the corresponding regions of the respective photodiodes 4 as the photodiode array 1 was. Where the photodiode array 41 is held in suction by the flat collet to be subjected to the flip chip bonding, the noncorresponding region of each photodiode 4 comes into contact with the flat collet and functions to secure the clearance between the flat collet and the corresponding region of each photodiode 4. In this configuration, the corresponding region of each photodiode 4 is protected by the noncorresponding region so as to be kept out of direct contact with the flat collet. Therefore, the corresponding regions of the respective photodiodes 4 get rid of direct stress due to pressure and direct stress due to heat, whereby the accumulation layer 8 in the corresponding regions is free of physical damage. In the photodiodes 4 there is neither dark current nor noise caused by crystal defects or the like due to such damage. In consequence, the photodiode array 1 is able to perform photodetection with high accuracy (at high S/N ratios).

In cases except for the flip chip bonding, for example, in a case where the photodiode array 41 is integrated with a scintillator to be used as a CT sensor, as described later, the scintillator is kept out of direct contact with the corresponding regions and it is thus feasible to avoid damage during mounting of the scintillator.

Next, a production method of the photodiode array 41 according to the present embodiment will be described on the basis of FIGS. 3 to 6 and FIGS. 17 to 22.

First, the steps described with FIGS. 3 to 6 are executed in the same manner as in the case of the photodiode array 1. Next, the back surface of the n-type silicon substrate 3 is polished to make the n-type silicon substrate 3 thinner (into a thin plate) before the thickness of the n-type silicon substrate 3 becomes a predetermined thickness. Subsequently, a silicon nitride film (SiN) 23 is formed on the front surface and on the back surface of the n-type silicon substrate 3 by LP-CVD (or plasma CVD), and thereafter the silicon oxide film 22 and silicon nitride film 23 on the front surface side are patterned with a predetermined photomask to form openings at intended positions for formation of the respective depressions 45 (cf. FIG. 17).

Figure 16:
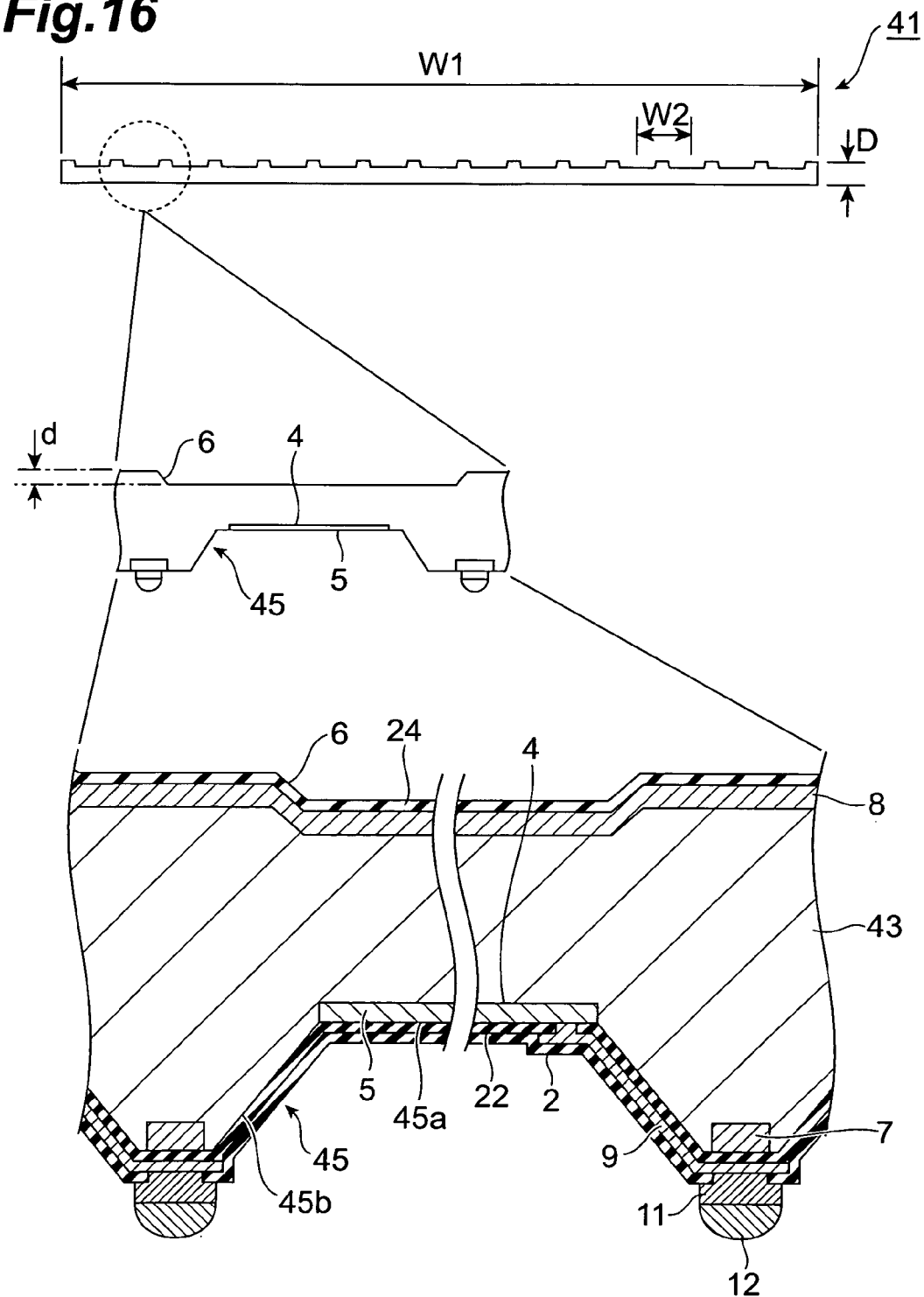
FIG. 16 is a view for explaining the configuration of the photodiode array according to the second embodiment.
Figure 17:
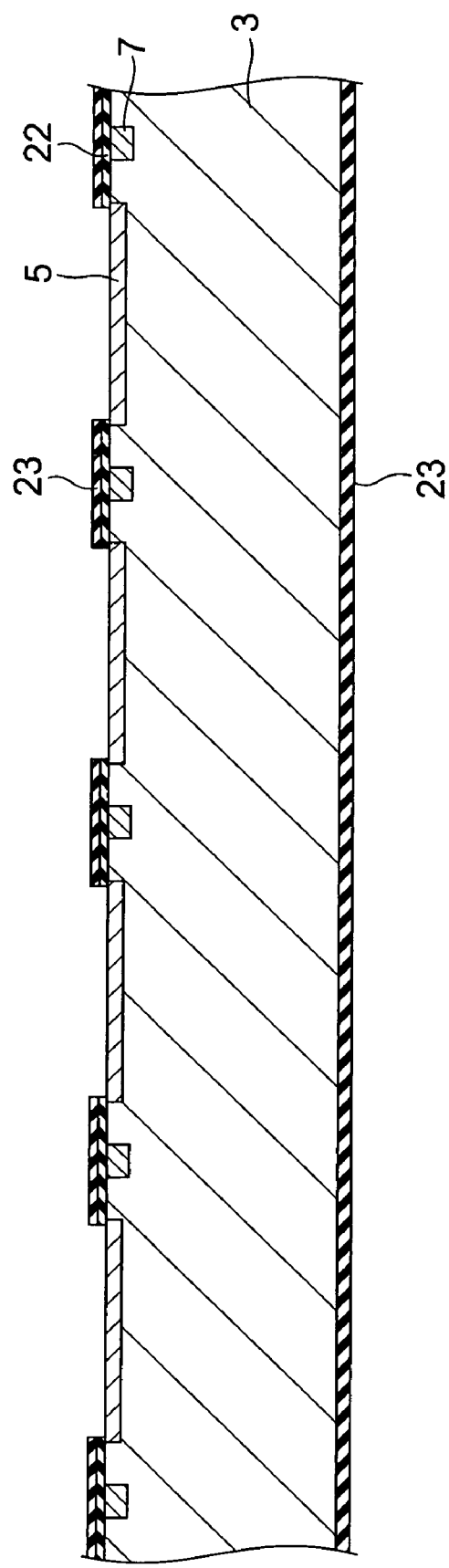
FIG. 17 is a view for explaining a production step of the photodiode array according to the second embodiment.
Figure 24:
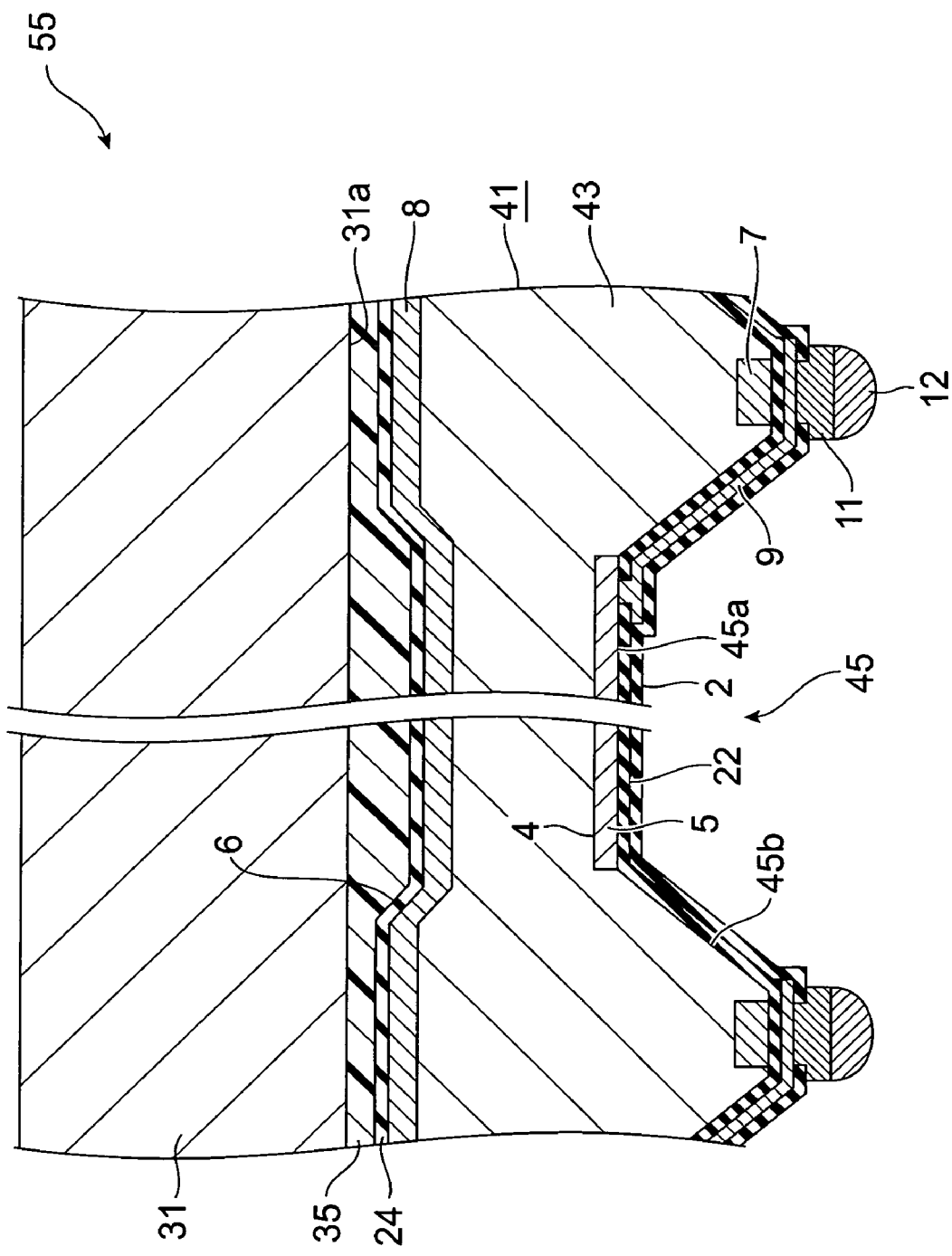
FIG. 24 is a view showing a sectional configuration of a radiation detector according to the fourth embodiment.
Figure 26:
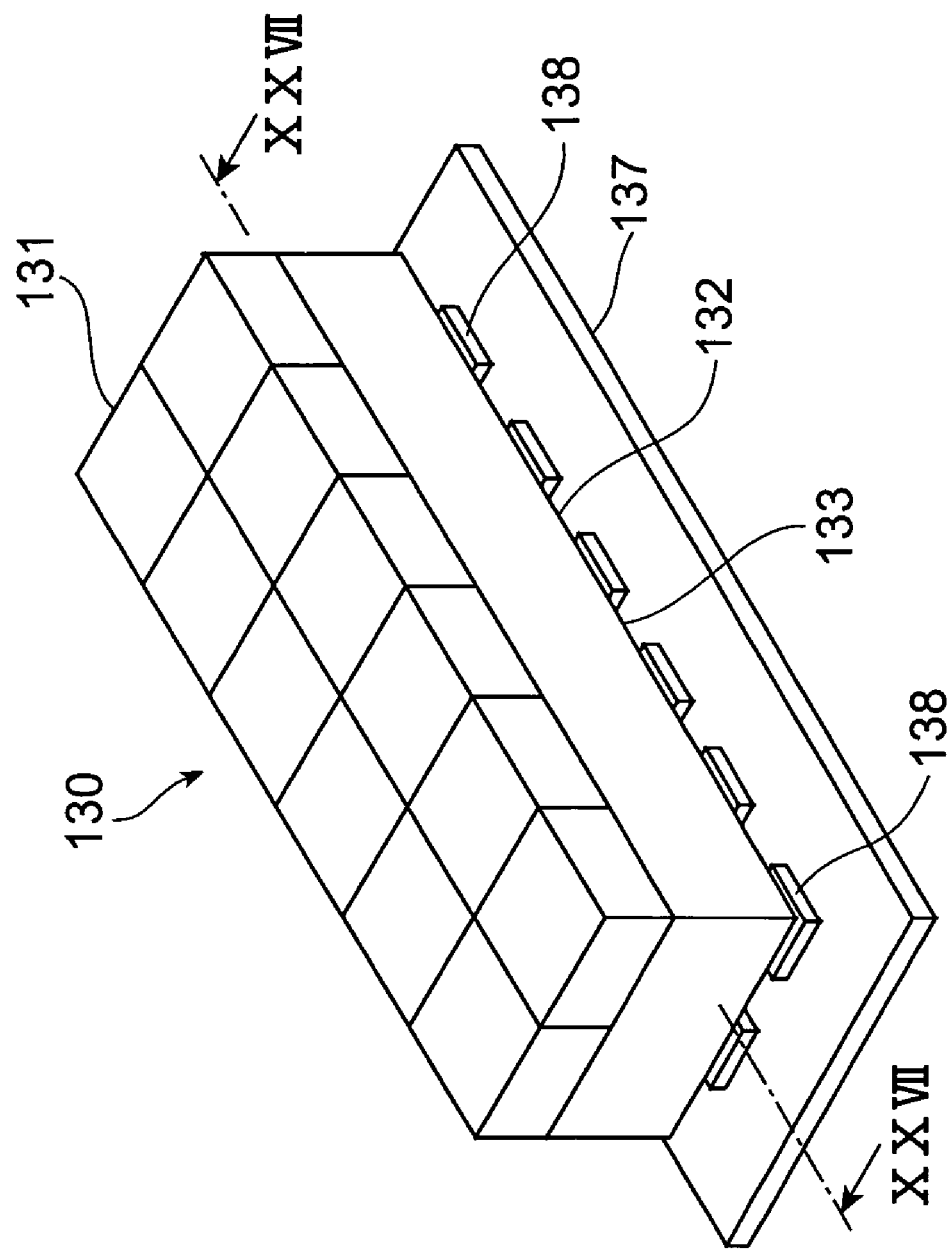
FIG. 26 is a perspective view showing a photodiode array according to the conventional technology.

Next, the p-type impurity diffused layer 5 and n-type silicon substrate 3 are removed by alkali etching to form a depression 45 so as to leave a frame peripheral part 5a of p-type impurity diffused layer 5, for each target of a region where the p-type impurity diffused layer 5 is formed, in the front surface of the n-type silicon substrate 3. This results in obtaining an n-type silicon substrate 43. At this time, the frame peripheral part 5a is formed as a region resulting from diffusion with a p-type impurity, in the edge part of the opening of each depression 45. Each depression 45 comes to have a side face 45b and a bottom portion 45a. The frame peripheral part 5a is not always essential. When the frame peripheral part 5a is formed, it provides the effect of preventing noise and dark current due to damage in the edge part formed by etching for formation of the depressions 45. FIGS. 15, 16, and 24 show the example without formation of the frame peripheral part 5a.

Subsequently, the bottom portion 45a of each depression 45 thus formed is doped with boron or the like. This results in forming a p-type impurity diffused layer 5b in the bottom portion 45a of each depression 45, and the photodiodes 4 comprised of pn junctions of such p-type impurity diffused layers 5b and n-type silicon substrate 43 are formed in two-dimensional arrangement of a vertical and horizontal array. Then a silicon oxide film 22 is formed on the regions not covered by the silicon nitride film 23 formed on the front surface. At this time, though not shown, the silicon oxide film is also formed on the silicon nitride film 23 formed on the back surface.

Figure 18:
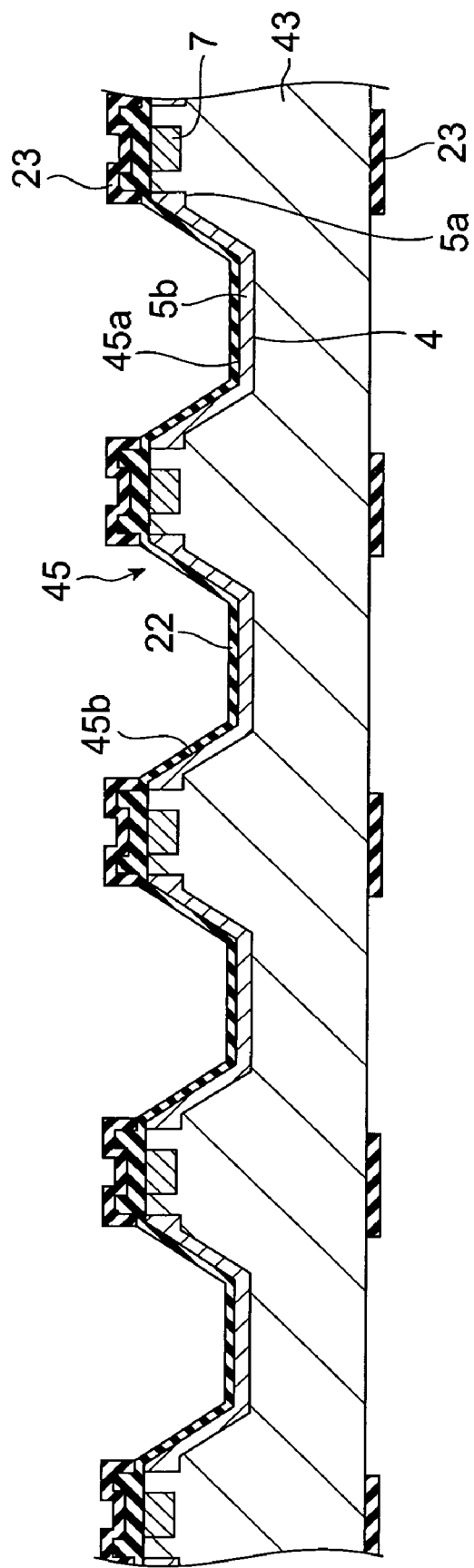
FIG. 18 is a view for explaining a production step of the photodiode array according to the second embodiment.
Figure 19:
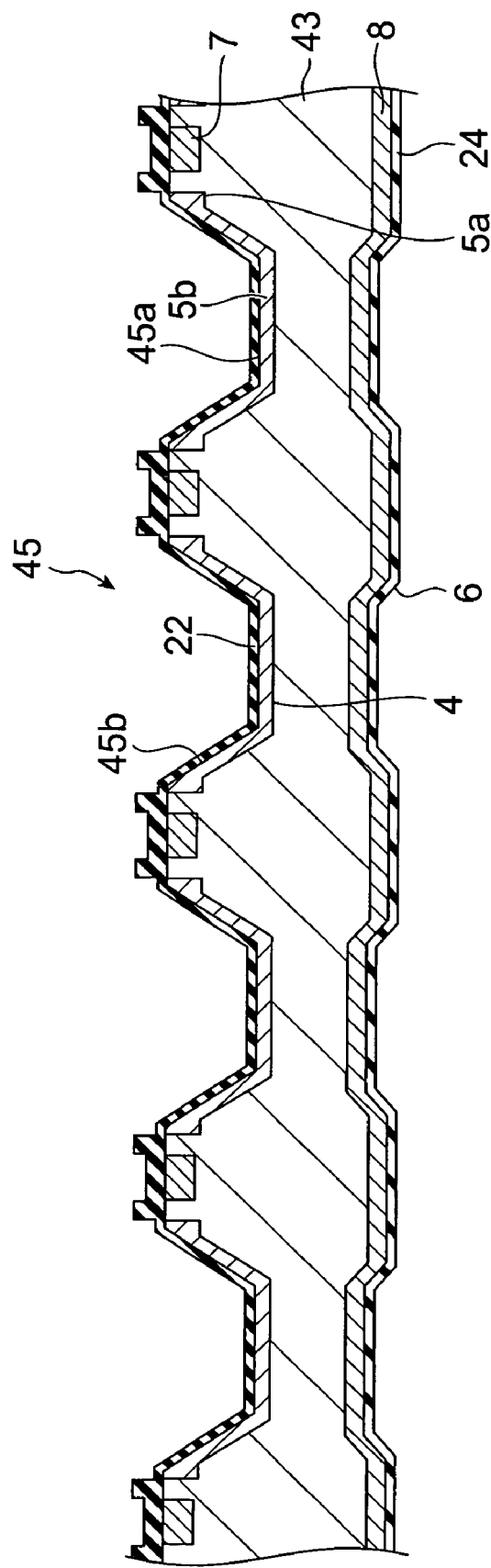
FIG. 19 is a view for explaining a production step of the photodiode array according to the second embodiment.
Figure 20:
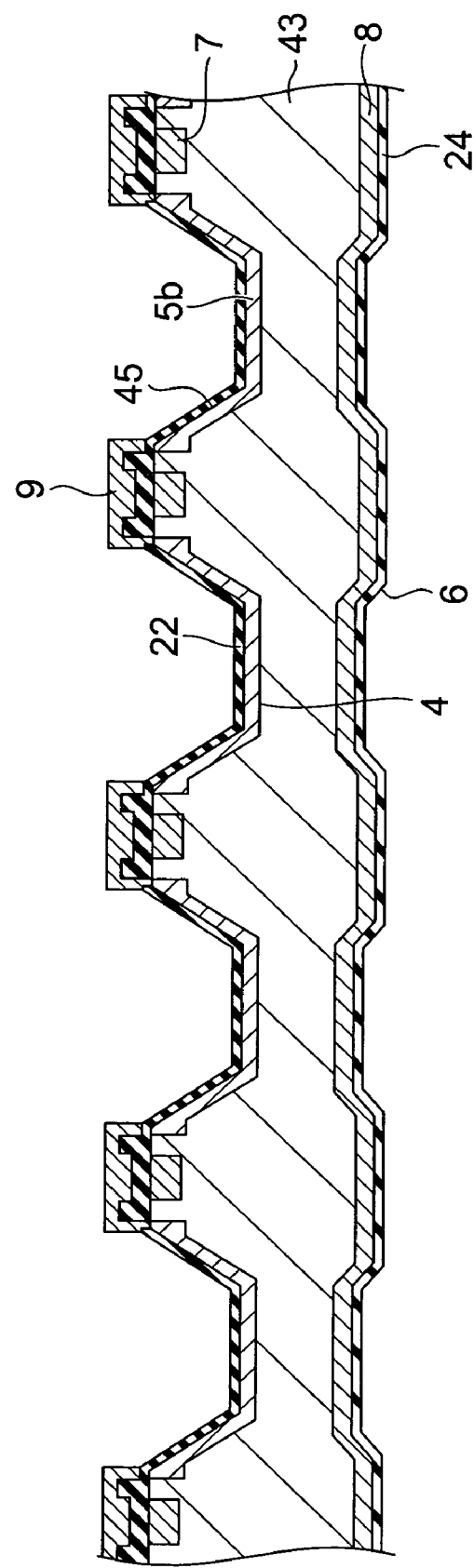
FIG. 20 is a view for explaining a production step of the photodiode array according to the second embodiment.
Figure 21:
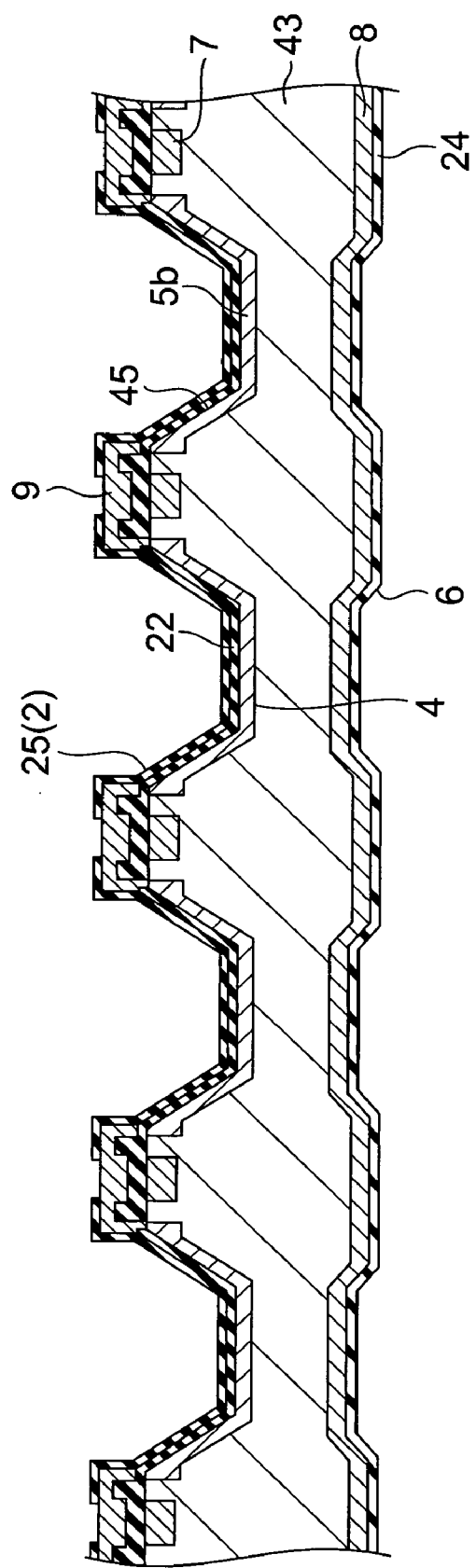
FIG. 21 is a view for explaining a production step of the photodiode array according to the second embodiment.
Figure 22:
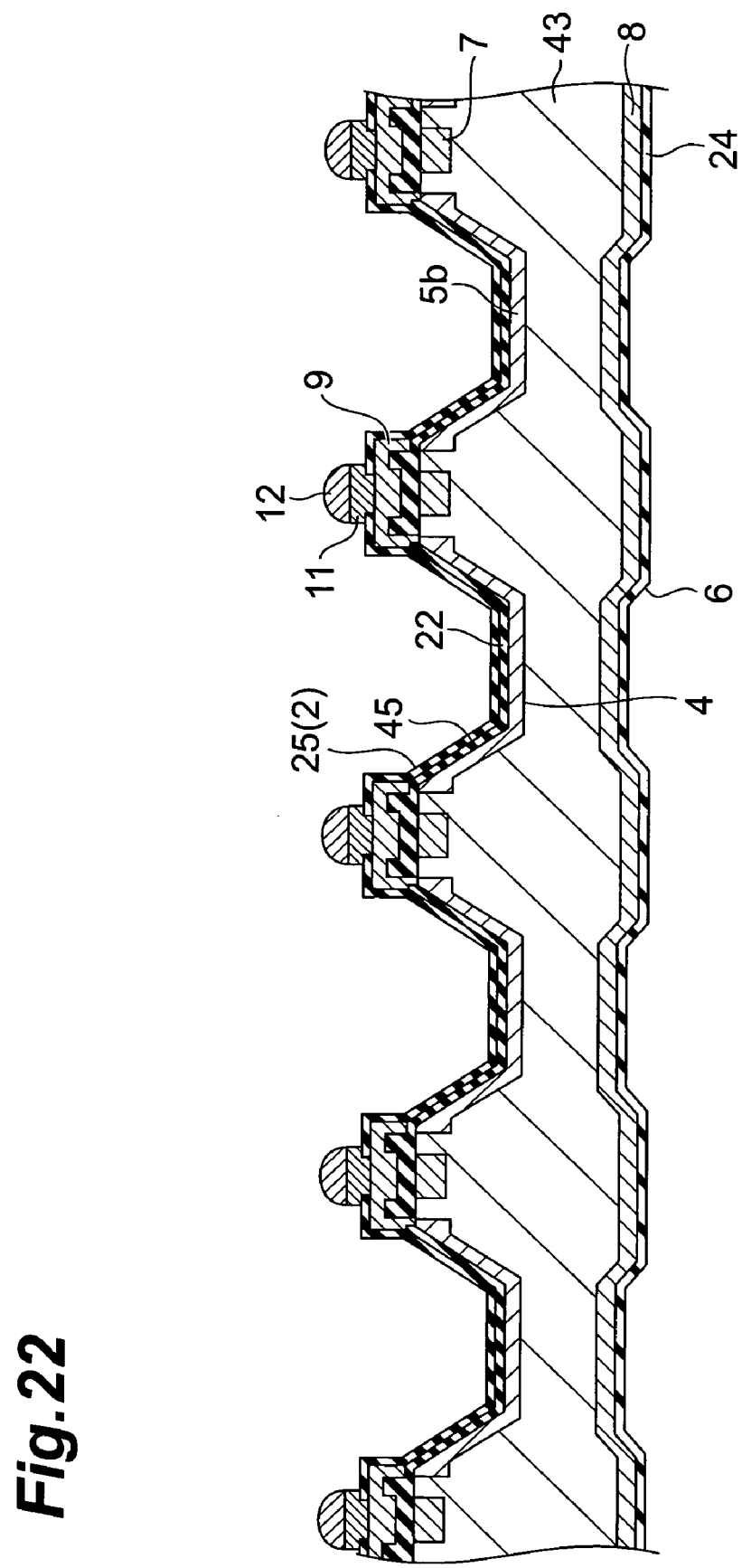
FIG. 22 is a view for explaining a production step of the photodiode array according to the second embodiment.

Next, patterning with a predetermined photomask is conducted on the silicon nitride film 23 formed on the back surface side of the n-type silicon substrate 43, to remove the intended regions for formation of the respective depressions 6, i.e., the silicon nitride film 23 from the corresponding regions of the photodiodes 4 and to leave the portions where the depressions 6 are not formed, i.e., the silicon nitride film 23 in the noncorresponding region of the photodiodes 4 (cf. FIG. 18). In this step, the regions where the silicon nitride film 23 is left can be properly modified, whereby the noncorresponding region (wall portions 13a, 13c, 13d, 13e, 13f) can be formed in the aforementioned various patterns.

Next, the n-type silicon substrate 43 is etched by anisotropic alkali etching with potassium hydroxide solution (KOH), TMAH, or the like, using the left silicon nitride film 23 as a mask, to form the depressions 6 in the portions not covered by the silicon nitride film 23. Thereafter, the left silicon nitride film 23 is removed. Then ion implantation with an n-type ion species or the like is carried out in the same manner as in the first embodiment to form the aforementioned accumulation layer 8 with the impurity concentration higher than that of the n-type silicon substrate 43. Furthermore, thermal oxidation is performed to form the AR film 24 on the accumulation layer 8 (cf. FIG. 19).

Then, in the formed region of each photodiode 4 a contact hole extending up to each p-type impurity diffused layer 5b is formed in the silicon oxide film 22 on the front surface side by photoetching technology. Subsequently, an aluminum metal film is formed on the silicon oxide film 22 by evaporation and thereafter patterned with a predetermined photomask to form the electrode wirings 9 (cf. FIG. 20).

Next, an SiN film 25 to become the passivation film 2 is formed on the silicon oxide film 22 so as to cover the electrode wirings 9. The SiN film 25 can be formed by sputtering, plasma CVD, or the like. Subsequently, contact holes are formed at positions corresponding to the respective electrode wirings 9 in the SiN film 25 (cf FIG. 21). Subsequently, the UBM 11 electrically connected with each electrode wiring 9 through the contact hole is formed by electroless plating or the like in the same manner as in the first embodiment. Then the bump electrode 12 is formed over each UBM 11 (cf. FIG. 22).

Through the above steps, the production method permits us to produce the photodiode array 41 capable of performing photodetection with high accuracy, without occurrence of the noise and dark current due to damage during mounting. The drawings show only the extraction of the anode electrodes, but the cathode (substrate) electrodes can also be extracted from the n$^+$-type impurity regions 7 (though not shown) in the same manner as the anode electrodes.

Third Embodiment

Next, a radiation detector according to the third embodiment will be described.

Figure 23:
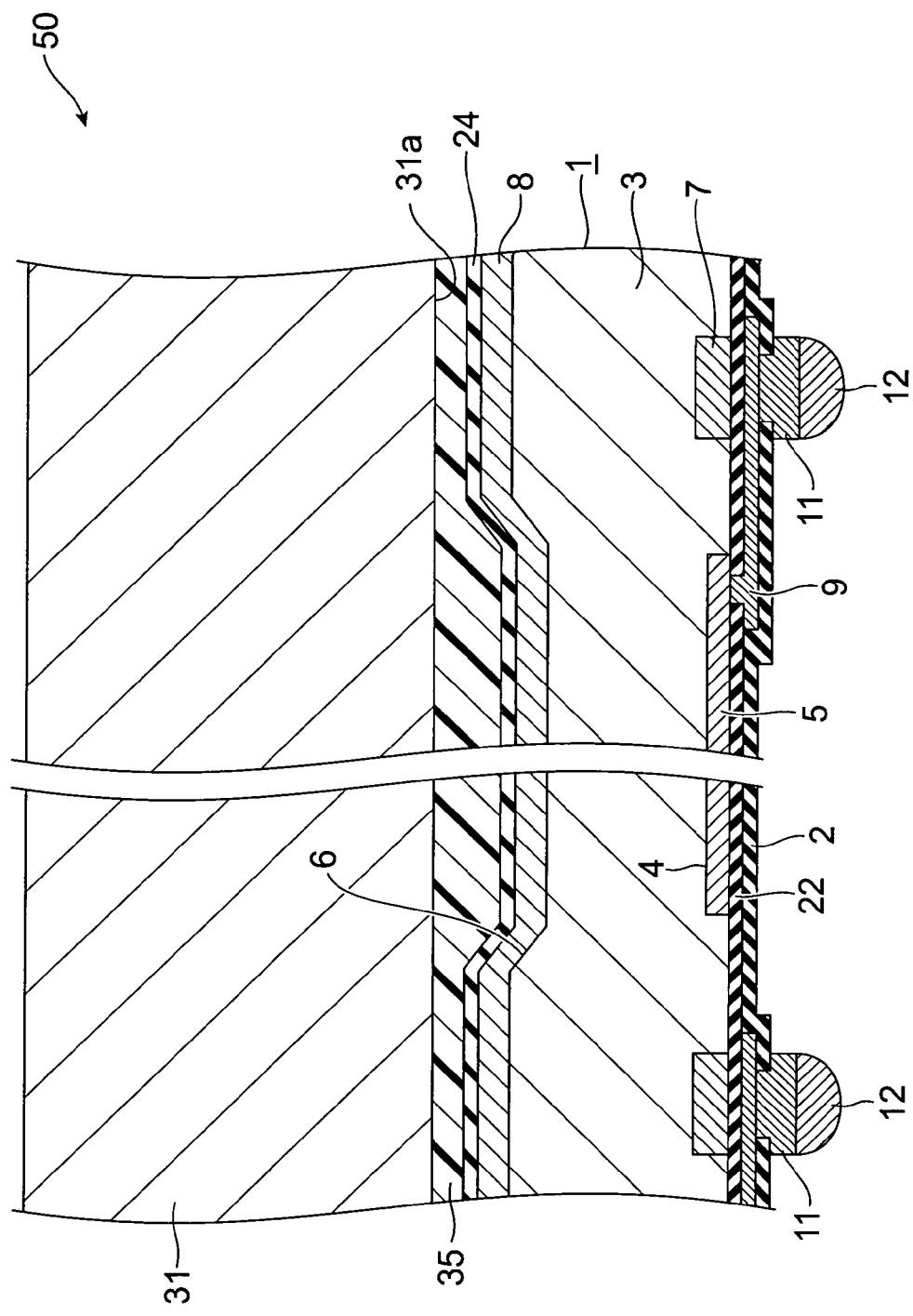
FIG. 23 is a view showing a sectional configuration of a radiation detector according to the third embodiment.

FIG. 23 is a view showing a sectional configuration of radiation detector 50 according to the present embodiment. This radiation detector 50 has a scintillator panel 31 arranged to emit light with incidence of radiation, and the aforementioned photodiode array 1. The scintillator panel 31 emits light generated with incident radiation, from its light exit surface 31a. The scintillator panel 31 is arranged opposite to the light-incident surface of photodiode array 1, i.e., opposite to the surface with the depressions 6 in the photodiode array 1. When the light emerging from the light exit surface 31a of scintillator panel 31 is incident on the light-incident surface, the photodiode array 1 converts the incident light into electric signals.

The scintillator panel 31 is mounted on the back surface side (incident surface side) of the photodiode array 1. Since the photodiode array 1 is provided with the aforementioned depressions 6, the back surface of the scintillator panel 31, i.e., the light exit surface 31a is in contact with the noncorresponding region of the photodiodes 4, but is kept out of direct contact with the corresponding regions of the photodiodes 4. The space between the light exit surface 31a of the scintillator panel 31 and the depressions 6 is filled with an optical resin 35 having a refractive index set so as to sufficiently transmit the light. This optical resin 35 allows the light from the scintillator panel 31 to efficiently enter the photodiode array 1. This optical resin 35 can be selected from epoxy resin, acrylic resin, urethane resin, silicone resin, fluororesin, etc. with the property of transmitting the light from the scintillator panel 31, or may be one of composite materials of these resins.

In an operation of bonding the photodiode array 1 onto an unrepresented mounting wiring board, the flat collet holds the photodiode array 1 under suction. However, since the photodiode array 1 is provided with the aforementioned depressions 6, the sticking surface of the flat collet is kept out of direct contact with the corresponding regions of the respective photodiodes 4. When the scintillator panel 31 is mounted, its light exit surface 31a is not in direct contact with the corresponding regions of the photodiodes 4, either. Therefore, the radiation detector 50 having such photodiode array 1 and scintillator panel 31 is able to prevent occurrence of noise, dark current, etc. due to damage of the corresponding regions in the mounting. In consequence, the radiation detector 50 is able to accurately perform photodetection and, in turn, to accurately perform radiation detection.

Fourth Embodiment

Next, a radiation detector according to the fourth embodiment will be described.

FIG. 24 is a view showing a sectional configuration of radiation detector 55 according to the present embodiment. This radiation detector 55 has a scintillator panel 31, and the aforementioned photodiode array 41. The scintillator panel 31 is arranged opposite to the light-incident surface of photodiode array 41, i.e., opposite to the surface where the depressions 6 are provided in the photodiode array 41.

The scintillator panel 31 is mounted on the back surface side (incident surface side) of the photodiode array 41. Since the photodiode array 41 is provided with the aforementioned depressions 6, the back surface of the scintillator panel 31, i.e., the light exit surface 31a is kept out of direct contact with the corresponding regions of the photodiodes 4. The space between light exit surface 31a of scintillator panel 31 and depressions 6 is filled with the optical resin 35. This optical resin 35 allows the light from the scintillator panel 31 to efficiently enter the photodiode array 41.

In an operation of bonding the photodiode array 41 to an unrepresented mounting wiring board, the flat collet holds the photodiode array 41 under suction. However, since the photodiode array 41 is provided with the aforementioned depressions 6, the sticking surface of the flat collet is not in direct contact with the corresponding regions of the respective photodiodes 4. When the scintillator panel 31 is mounted, its light exit surface 31a is also kept out of direct contact with the corresponding regions of the photodiodes 4. Therefore, the radiation detector 55 having such photodiode array 41 and scintillator panel 31 is able to prevent occurrence of noise, dark current, etc. due to damage of the corresponding regions in the mounting. In consequence, the radiation detector 55 is able to accurately perform photodetection and, in turn, to accurately perform radiation detection.

INDUSTRIAL APPLICABILITY

The present invention is applicable to X-ray CT scanners and radiographic image taking systems.

The invention claimed is:

1. A photodiode array comprising a semiconductor substrate of a first conductive type,
    wherein a plurality of photodiodes are formed in array on an opposite surface side to an incident surface of light to be detected, in the semiconductor substrate,
    wherein a plurality of impurity diffused layers of a second conductive type are arranged in array on the opposite surface side to the incident surface of light to be detected, in the semiconductor substrate,
    wherein each of the plurality of photodiodes is formed by pn junction formed of the impurity diffused layer and the semiconductor substrate,
    wherein a plurality of depressions with a predetermined depth more depressed than a regions not corresponding to a region where the respective photodiodes is formed, are formed in the respective regions corresponding to the respective photodiodes is formed, on a side of the incident surface of the light to be detected, in the semiconductor substrate, and
    wherein adjacent depressions are in communication with each other at their respective corners, in the semiconductor substrate.

2. The photodiode array according to claim 1, wherein the semiconductor substrate is provided with an impurity region between the photodiodes adjacent to each other, for separating the photodiodes from each other.

3. The photodiode array according to claim 1, wherein a high-impurity-concentration layer of the same conductivity type as the semiconductor substrate is formed on the incident surface side of the light to be detected, in the semiconductor substrate.

4. A radiation detector comprising:
    the photodiode array as set forth in claim 1; and
    a scintillator panel arranged opposite to the incident surface of the light to be detected in the photodiode array, and arranged to emit light with incidence of radiation.

5. The photodiode array according to claim 2, wherein a high-impurity-concentration layer of the same conductivity type as the semiconductor substrate is formed on the incident surface side of the light to be detected, in the semiconductor substrate.

6. A radiation detector comprising:
    the photodiode array as set forth in claim 2; and
    a scintillator panel arranged opposite to the incident surface of the light to be detected in the photodiode array, and arranged to emit light with incidence of radiation.

7. A radiation detector comprising:
    the photodiode array as set forth in claim 3; and
    a scintillator panel arranged opposite to the incident surface of the light to be detected in the photodiode array, and arranged to emit light with incidence of radiation.

* * * * *